United States Patent
Gourmel

(10) Patent No.: US 11,593,584 B2
(45) Date of Patent: Feb. 28, 2023

(54) METHOD FOR COMPUTATION RELATING TO CLUMPS OF VIRTUAL FIBERS

(71) Applicant: Unity Technologies SF, San Francisco, CA (US)

(72) Inventor: Olivier Gourmel, Wellington (NZ)

(73) Assignee: UNITY TECHNOLOGIES SF, San Francisco, CA (US)

( * ) Notice: Subject to any disclaimer, the term of this patent is extended or adjusted under 35 U.S.C. 154(b) by 236 days.

(21) Appl. No.: 17/098,209

(22) Filed: Nov. 13, 2020

(65) Prior Publication Data
US 2022/0004804 A1    Jan. 6, 2022

Related U.S. Application Data

(60) Provisional application No. 63/047,836, filed on Jul. 2, 2020.

(51) Int. Cl.
*G06K 9/62* (2022.01)
*G06T 19/00* (2011.01)
*G06F 17/18* (2006.01)

(52) U.S. Cl.
CPC .......... *G06K 9/6224* (2013.01); *G06F 17/18* (2013.01); *G06K 9/6215* (2013.01); *G06T 19/00* (2013.01)

(58) Field of Classification Search
None
See application file for complete search history.

(56) References Cited

U.S. PATENT DOCUMENTS

| | | | |
|---|---|---|---|
| 2010/0026717 A1* | 2/2010 | Sato | G06T 11/001 382/199 |
| 2010/0277475 A1 | 11/2010 | McAdams et al. | |
| 2011/0216074 A1* | 9/2011 | Witkin | G06T 13/40 345/473 |
| 2021/0385237 A1* | 12/2021 | Visbal | G06Q 40/00 |

FOREIGN PATENT DOCUMENTS

EP    2041725    4/2009

* cited by examiner

*Primary Examiner* — Saptarshi Mazumder
(74) *Attorney, Agent, or Firm* — Haynes and Boone, LLP

(57) ABSTRACT

A computer-implemented method for processing a set of virtual fibers into a set of clusters of virtual fibers, usable for manipulation on a cluster basis in a computer graphics generation system, may include determining aspects for virtual fibers in the set of virtual fibers, determining similarity scores between the virtual fibers based on their aspects, and determining an initial cluster comprising the virtual fibers of the set of virtual fibers. The method may further include instantiating a cluster list in at least one memory, adding the initial cluster to the cluster list, partitioning the initial cluster into a first subsequent cluster and a second subsequent cluster based on similarity scores among fibers in the initial cluster, adding the first subsequent cluster and the second subsequent cluster to the cluster list, and testing whether a number of clusters in the cluster list is below a predetermined threshold.

24 Claims, 12 Drawing Sheets

202
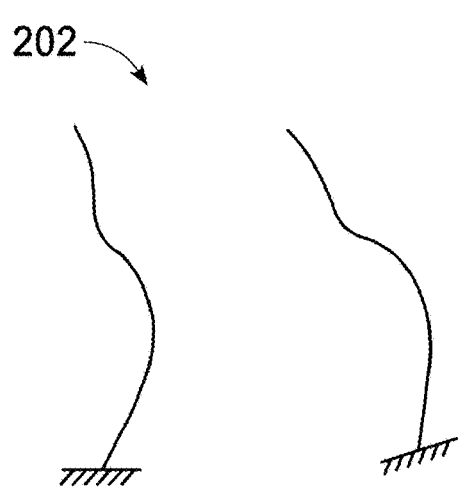
(a)
204
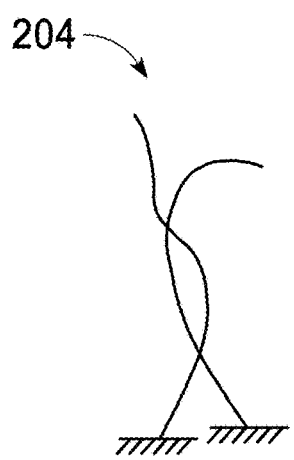
(b)
206
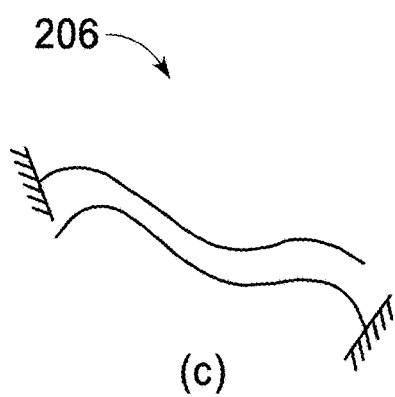
(c)
FIG. 2

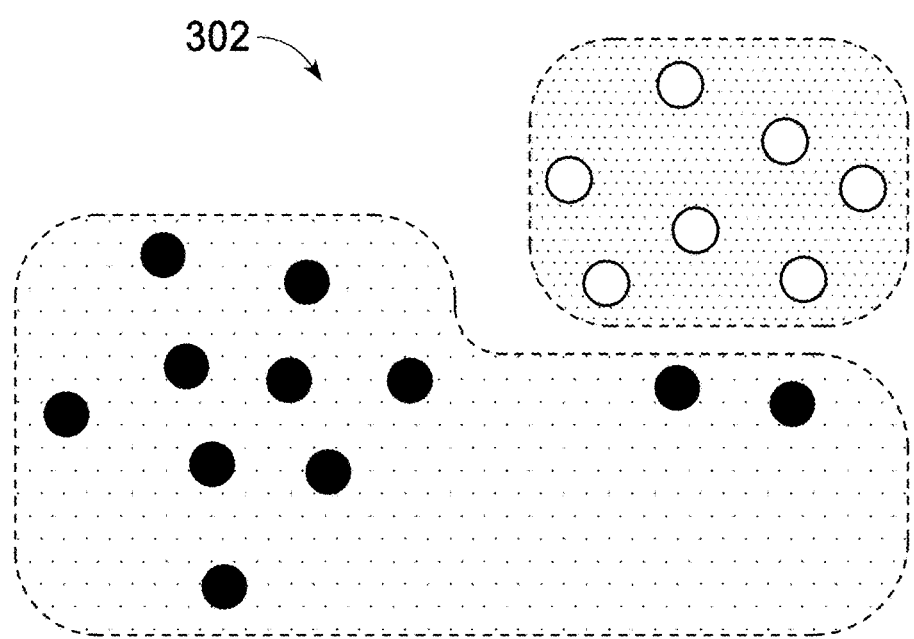
(a)
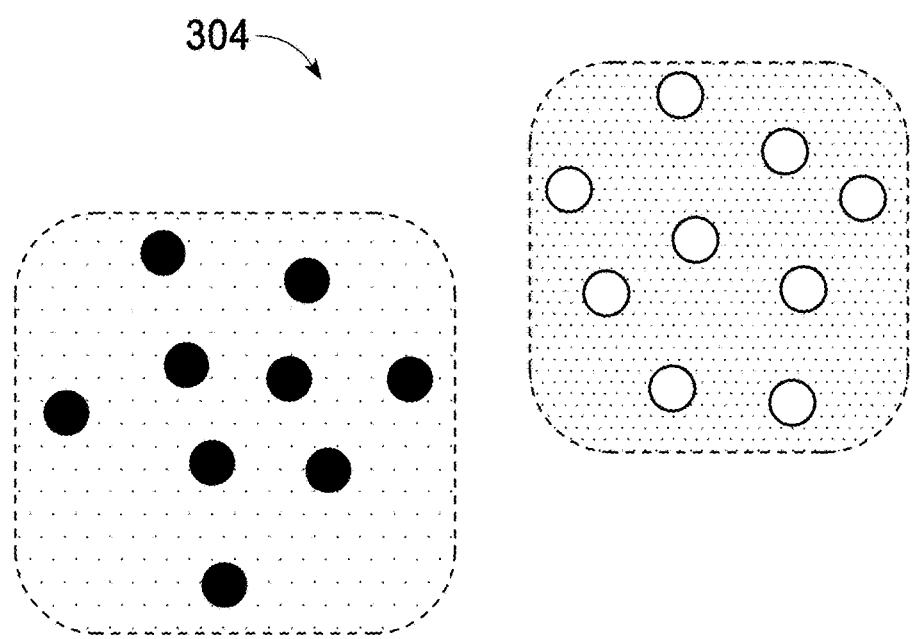
(b)
FIG. 3

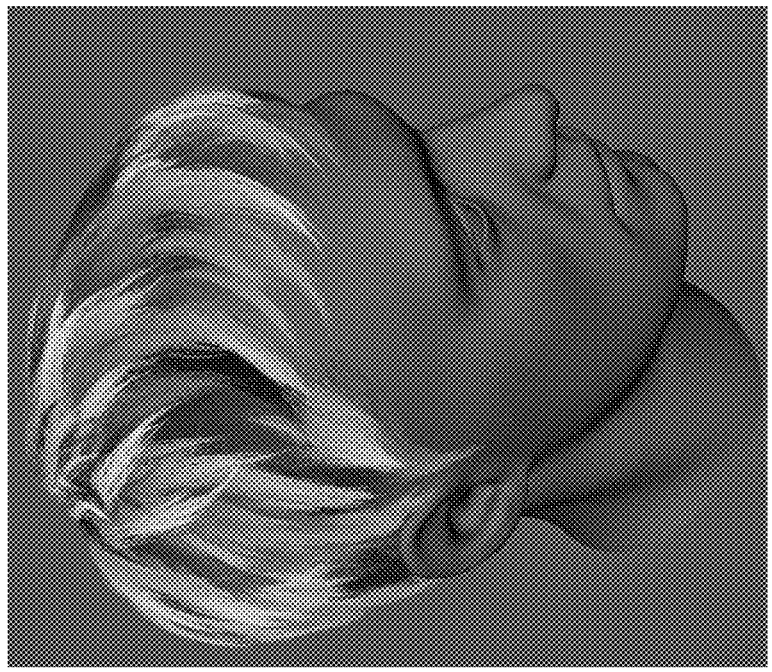
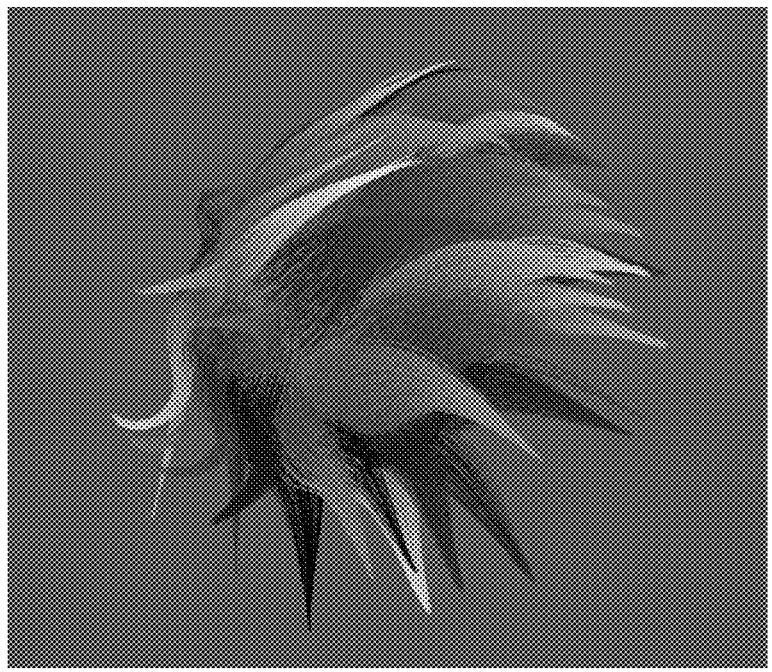
FIG. 9

METHOD FOR COMPUTATION RELATING TO CLUMPS OF VIRTUAL FIBERS

CROSS-REFERENCE TO RELATED APPLICATIONS

This application claims priority to and the benefit of U.S. Provisional Patent Appl. No. 63/047,836, filed Jul. 2, 2020, which is incorporated herein by reference in its entirety.

FIELD

The present disclosure generally relates to computer-generated imagery and more particularly to computations that are based on clumps of virtual fibers and computations to detect determine suitable clumpings of fibers.

BACKGROUND

As digital animation in movies and games has increased in popularity, so has the complexity of the models and the virtual environments in which they interact. Viewers demand continuously increasing visual richness of virtual environments in computer animated scenes, which has led game and movie creators to turn to physical simulation create realistic interactions between objects, such as by using a physics engine to output movements of objects that are consistent with real-world physics. In some ways, this is often a simple problem—how to determine natural-looking movements of a few rigid objects. For other simulations, such as those with many flexible objects, such as hair, fur, or other fibers, the number of degrees of freedom of individual objects or portions of objects is much greater, and typically computer simulation requires a trade-off between realism, resolution, and amount of computing resources available. Because of this trade-off, efficient computer simulation techniques can be important as they might allow for an increase in realism and/or resolution without requiring significant increases in computing resources.

For example, a higher spatial resolution is required to smoothly capture ultra-high resolution interaction of fibers (such as hair) than is typically used if hair were modeled as one large "wig" or "groom" which did not move as it interacted with the environment. When a visual effects ("VFX") shot requires hair to move realistically, the computing resources required to generate the hair can exceed those available. Some algorithms cannot scale to a high-enough number of fibers to allow for realistic simulation of individual fibers required in hair or a furry animal due to the heavy geometry of the models involved. A human groom can contain up to 10,000 or more strands of hair, with each strand potentially containing hundreds of vertices. Modelling each strand of hair as an individual fiber is computationally intensive.

The continuously increasing demand for visual richness of virtual environments has prompted the use of physical simulation to generate an ever larger portion of the final rendered frames. Various tools have been developed to enhance the realism of models, but simulation of individual fibers of hair or fur remains computationally intensive.

SUMMARY

A computer-implemented method may process a set of virtual fibers into a set of clusters of virtual fibers, usable for manipulation on a cluster basis in a computer graphics generation system. The method may comprise determining aspects for virtual fibers in the set of virtual fibers, determining similarity scores between virtual fibers based on their aspects, determining an initial cluster comprising the virtual fibers of the set of virtual fibers, instantiating a cluster list in a memory, adding the initial cluster to the cluster list, partitioning the initial cluster into a first subsequent cluster and a second subsequent cluster based on similarity scores among fibers in the initial cluster, adding the first subsequent cluster and the second subsequent cluster to the cluster list, partitioning the first subsequent cluster into a third subsequent cluster and a fourth subsequent cluster based on similarity scores among fibers in the first subsequent cluster, adding the third subsequent cluster and the fourth cluster to the cluster list, and testing whether a number of clusters in the cluster list is below a predetermined threshold.

The computer-implemented method may further comprise removing the initial cluster from the cluster list following the adding of the first subsequent cluster and the second subsequent cluster to the cluster list and removing the first subsequent cluster from the cluster list following the adding of the third subsequent cluster and the fourth subsequent cluster to the cluster list.

The first subsequent cluster may be selected by selecting a cluster having the largest number of fibers. Determining the initial cluster may comprise assigning the set of virtual fibers to the initial cluster.

For a selected first virtual fiber and a selected second virtual fiber selected from the set of virtual fibers, the selected first virtual fiber may comprise a first plurality of points and the selected second virtual fiber may comprise a second plurality of points. Determining similarity scores between virtual fibers may further comprise: for each point in the first plurality of points, identifying a corresponding closest point on the second fiber to each point; computing a Gaussian kernel based on the distance from each point in the first plurality of points to the respective corresponding closest point; computing a plurality of dot products, each dot product the dot product of a tangent to each point in first plurality of points and a tangent to the respective corresponding closest point; and computing a similarity score based on the Gaussian kernel and the plurality of dot products.

Determining similarity scores between virtual fibers may further comprise for a number K of similarity scores, for each virtual fiber of the set of virtual fibers, retaining only K similarity scores having highest values of similarity scores corresponding to each virtual fiber.

Partitioning the initial cluster into the first subsequent cluster and the second subsequent cluster may comprise, for each virtual fiber of the initial cluster, from corresponding similarity scores based on aspects of the virtual fiber, computing a corresponding coordinate comprising a plurality of eigenvectors corresponding to the virtual fiber, producing a plurality of coordinates. For each similarity score between a first virtual fiber and a second virtual fiber, a Euclidian distance from the corresponding coordinate of the first fiber to the corresponding coordinate of the second fiber may be computed, producing a plurality of edge values. Each virtual fiber in the initial cluster may be assigned to a corresponding set having one member. A min virtual fiber and a max virtual fiber in the initial cluster may be identified. The plurality of edge values may be sorted into a list. While the list is not empty, a shortest edge value may be removed from the list, and if the sets containing the min virtual fiber and the max virtual fiber remain disjoint, the sets containing virtual fibers corresponding to the shortest edge value may be merged.

The min virtual fiber and the max virtual fiber may be selected to correspond to a minimum and a maximum eigenvector.

A non-transitory computer-readable storage medium may store instructions, which when executed by at least one processor of a computer system, cause the computer system to carry out the method.

A computer-readable medium may carry instructions, which when executed by at least one processor of a computer system, cause the computer system to carry out the method.

BRIEF DESCRIPTION OF THE DRAWINGS

Various embodiments in accordance with the present disclosure will be described with reference to the drawings, in which:

FIG. 2 illustrates dissimilarities between fibers in accordance with an embodiment.

FIG. 3 illustrates two alternative cuts to partition a cluster in accordance with an embodiment.

FIG. 9 illustrates the results of applying spectral clump detection to two exemplary grooms in accordance with an embodiment.

DETAILED DESCRIPTION

Figure 1:
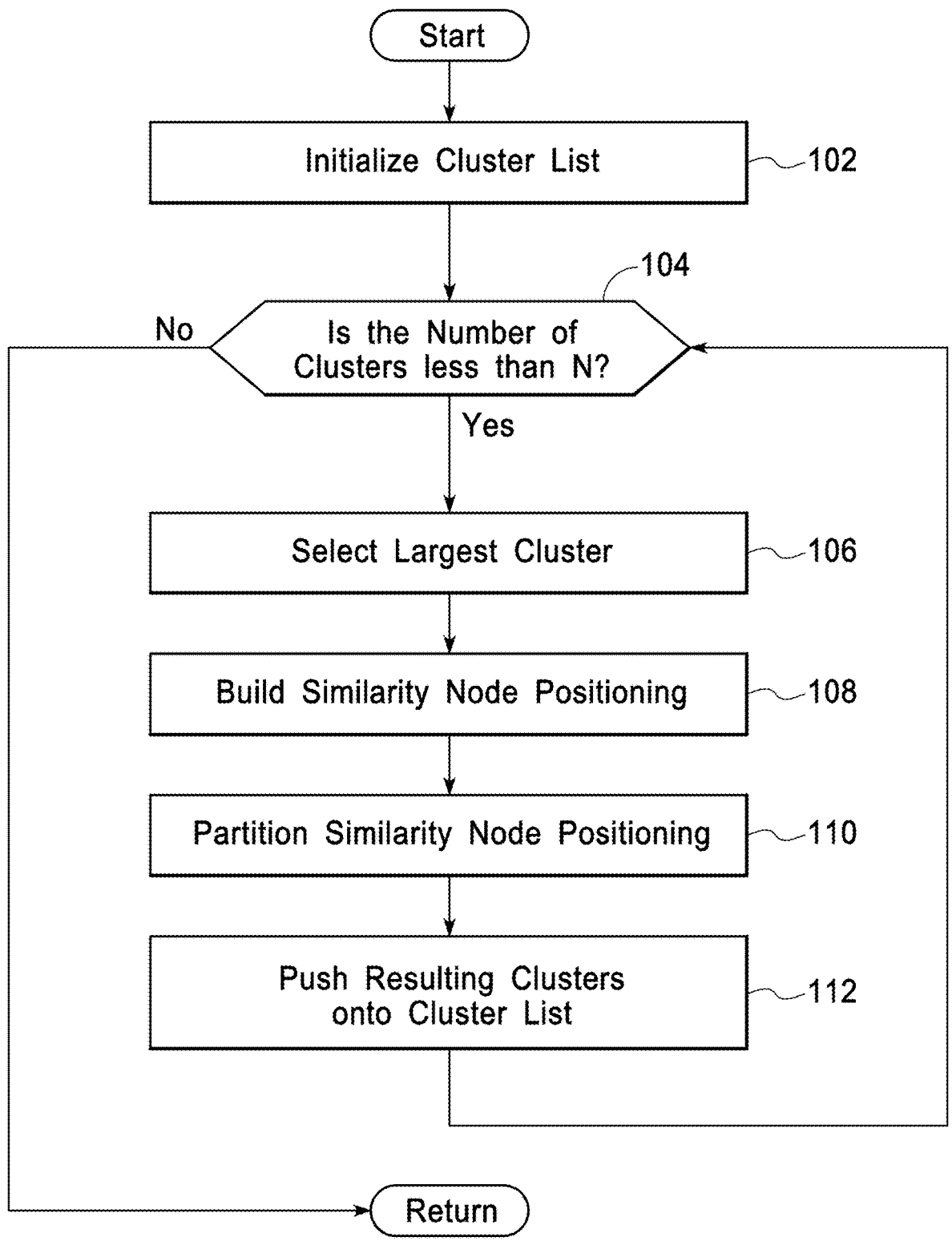
FIG. 1 illustrates a block diagram of a method of portioning a similarity positioning of nodes in n-dimensional space in accordance with an embodiment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Physical simulation of hair and fur remains a challenge due to the heavy geometry of the models involved. A typical human groom contains about 10,000 strands of hair while models of furry creatures may contain up to 10 million strands. Each strand of hair may be a fiber represented by a spline often containing between 10 and 200 vertices, or more, depending on its length and simulation resolution. For example, a fiber may correspond to a single strand of hair, fur, a feather, rope, a braid, or the like, which may be animated with other nearby fibers to form a groom, pelt, coat, or the like. Simulating behavior of fibers interacting with other fibers and objects need not be limited to hair or fur, or natural materials, but generally might apply to objects that are simulated as if they had behaviors and/or physical properties applicable to fibers.

It would be difficult to simulate every individual fiber in any simulation system where there are a large number of fibers. Fibers collide against their neighbors and the number of interactions grows quadratically with the hair density. Thus, a fiber rendering system may take advantage of the natural tendency of hair or fur to form clumps in a groom to avoid simulating every curve while still achieving realistic behaviour with less intensive computational costs, time, and resources. A clump may be a group of fibers that share a similar shape and dynamic behaviour such that they are amenable to being treated collectively and possibly independently of some other clumps. A fiber rendering system can capture most of the look of an animated groom by simulating a single curve per clump. As there would be expected to be many fewer clumps than fibers, this approach may be less computationally intensive as it may not require animation of single fibers while still preventing the difficulties in simulating every fiber. Further, less individual inputs per fiber are required.

However, identifying the clumps may be computationally challenging. In a modeled groom, the clumps may result from successive procedural operations such as growing the curves from a vector field, blending between sets of curves or cloning another piece of groom. In these cases, the different clump sets are not explicitly defined and may need to be recovered from the shape of the fibers. An artist might manually create hair clumps and simulate the hair clumps as elements, but when the clump sets are not explicitly defined, recovering the clumps may require a great deal of time by an artist. To address this, the fiber rendering system may use a spectral clump detection technique described herein to automatically identify clumps with less, minimal, or no user inputs from an artist.

Automatically identifying clumps of elements provides a simplified input to a simulator. The simulator can then simulate interactions of clumps rather than interactions of individual elements, and then can populate the simulated clumps with their member elements, decreasing the computational intensity of simulating the elements individually. Since it may not be required to simulate every fiber in order to get a realistic behavior, as hair tends to naturally form clumps, simulating the clumps may be simpler than simulating each fiber while providing the same or similar results in animating, thereby reducing computational time and resources of the animation system. In a good simulation, the hair strands (or other fibers) in a clump might all share a similar shape and dynamic behavior, and so most of the look of an animated groom can be captured by simulating a single curve per clump. A simulation variable of a hair clump might be its mass (perhaps determined from a sum of lengths of hair strands in the clump, summed over the members of the clump and multiplied by a global hair density parameter) and a spline that represents a path taken by a clump path.

A "like element" may be a simulation element that has something in common with other like elements in a set. An example is hair, where multiple hair elements have common characteristics, such as being fibers, having similar cross-sectional thicknesses, etc. It should be understood that examples of techniques that use hair strands as the like elements are not so limited and could be used for simulation of other sets of like elements, such as fur, feathers, braids, rope, scales, and the like. While examples herein might refer to hair, it should be understood that unless otherwise indicated, the examples can apply to fur, fur-like elements, hair-like elements, fibers, and similar sets of like elements.

A "groom" may be a set of fibers that are intended to represent the hair, fur, pelt, or other surface feature of a character (or possibly a noncharacter object) that might be simulated.

Simulation may be a process of determining, given a set of elements and inputs to a scenario, how the elements of the set would behave or evolve given the inputs. In many examples described here, simulation is a step in an animation process, wherein the animation process outputs indications of movements of the elements of the set given the inputs and some applied physical constraints, which can then be used to drive a visualization generator such as a renderer to provide an animated view of those elements undergoing those movements. The physical constraints might correspond to real-world physical constraints (e.g., gravity causes denser objects to move downward in a vacuum or less dense fluid, solid objects cannot forcelessly pass through each other, connected objects remain connected, etc.) but might instead correspond to artistic physical constraints that do not correspond to real-world physical constraints.

To identify clumps, a fiber rendering system might use a "clumping process" which is a computer process to assign each hair fiber of a set of hair fibers to an associated clump. In a simple case, each hair fiber may be a member of one clump and each clump comprises one or more hair fibers. Other variations are possible, such as where not all hair fibers are assigned to a clump. An output of a clumping process might be a data structure that indicates a clump identifier for each hair fiber.

An overview of a specific clumping process will now be described, as performed by an appropriately programmed processor or suitable electronic hardware, starting with all of the fibers to be clumped being assigned to one cluster. In one embodiment, the initial set of fibers may be the whole groom. However, in other embodiments, the initial set of fibers may also be a portion of the groom or a clump of the groom. The clumping process is provided with a target number, N, of clumps. The target number of clumps can be an artist-controllable parameter or may be automatically defined, such as based on number of fibers in the groom, size of the groom, required definition and/or resolution of the groom and/or corresponding character, scene size and/or placement of the groom within a scene, and the like. This clumping process completes when the initial cluster is iteratively split into disjoint clusters until the target number of clusters N is reached. The final N clusters may then be used as the clumps. Each step of the iterative splitting might be binary, e.g., splitting an existing cluster into two new clusters, but that may not be required.

The splitting operation may evaluate fibers to keep fibers that are alike in the same cluster. For such a splitting operation, a similarity metric between fibers might be computed and used to determine whether to keep fibers together in a cluster. A few examples of similarity metrics that can be computed are described below. Using such similarity metrics, a clumping process start with a list, L, initialized to include one cluster representing S, the set of all fibers. Then, the clumping process may construct a similarity positioning, location, or the like of nodes or other values representing fibers in n-dimensional space as described below, and partition the cluster into two clusters. One method of partitioning is the spectral clustering process described below, however, other methods may also be used. Then S is replaced by the two new clusters on list L. This continues until the list L has N clusters. In subsequent steps, the cluster selected for partition might be the cluster having the largest numbers of fibers, but other selection criteria might be used.

In one embodiment, the set of fibers is iteratively split into pairs of disjoint clusters, until a target number of clumps N is reached. As discussed above, the splitting operation is designed to keep fibers that are alike in the same cluster. Fibers may be assigned to clusters based on a similarity metric which provides a measure of the similarity of any two fibers in terms of shape and orientation. This similarity metric is used in the construction of a sparse similarity positioning of nodes in n-dimensional space which links each fiber to its most similar neighbors. The computation of the clumps is then a matter of finding a relevant clustering of the similarity graph, which is done using a spectral clustering technique.

A method for performing this clumping process is shown in FIG. 1. Note that one or more steps, processes, and methods described herein of FIG. 1 may be omitted, performed in a different sequence, or combined as desired or appropriate.

In step 102, the cluster list is initialized. In one embodiment, the cluster list may be initialized with all fibers, though it may instead be initialized with a subset of fibers, selected either by an operator or by another operation including automated operations to select a subset of the fibers based on the specific groom and the groom's parameters, parameters of a scene or corresponding character, and the like. The set of hairs or fibers may be contained in a model which specifies, for each fiber, an origin point, a follicle vector (representing an initial direction of the fiber), and a piecewise linear path the fiber takes in a 3D space. The model might include global values for fiber stiffness, fiber thickness that apply to all the fibers in the model, and other global values for the fibers within the groom. There might also be models where some of those values are not global but vary over the set of fibers, such as within specific portions of the fibers designated for different fiber stiffness, thickness, and the like.

In step 104, if the number of clusters is less than N, the method proceeds in order to determine clumps of fibers within the corresponding groom, otherwise, the method exits. At step 106, the fiber rendering system selects the cluster containing the most fibers from the cluster list so that a largest clump of fibers within the groom is selected. At step 108, the fiber rendering system builds a similarity positioning of nodes in n-dimensional space for the selected cluster. A similarity positioning of nodes in n-dimensional space is a weighted representation of those nodes within a visualization of those nodes (e.g., in a 2D system or space, although 3D spaces may also be used if applicable) where each node corresponds to a fiber. The fiber rendering system may assign a positive weight to each edge which corresponds to a similarity score given to each pair of fibers. The similarity score indicates how likely the fibers are to belong to the same clump. In an embodiment with similarity scores between 0 and 1 inclusive, a score of 1 means the fibers are close in shape and position and thus they are more likely to be members of the same clump, while a score of 0 means they are sufficiently different to be unlikely to belong to the same clump. Different ranges of similarity scores may be used (e.g., positive and negative values, values ranging from 0 to an upper bound such as 100 or a maximum integer value).

At step 110, the fiber rendering system partitions the similarity positioning of nodes in n-dimensional space into two clusters using spectral clustering or other clustering processes and operations. At step 112, the fiber rendering system pushes the two clusters onto the cluster list so that the cluster list includes the two newly formed clusters and any previously determined clusters. This continues using the largest cluster in the cluster list until N clusters are reached. Once the number of clusters reaches N, the method exits.

In general, a simplified version of the steps of FIG. 1 may be represented by the following steps, which might be performed by a processor or expressed as pseudocode:

1. Initialize the cluster list: L←{S} where S is the set of all fibers.
2. If |L|<N, perform steps 3-6, and return to this step 2. Stop when |L|=N.
3. Select a cluster, $C_{next} \in L$ and remove it from the list: L←L\$C_{max}$. In an embodiment, $C_{next}=C_{max}$, where $C_{max}$ is a cluster having the maximum number of fibers among the existing clusters.
4. Build a similarity graph, G, of the fibers in $C_{next}$ as described elsewhere herein.
5. Partition G into two clusters {A, A⁻}, perhaps using spectral clustering, where "A⁻" refers to A-bar.
6. Push the resulting two clusters into the list: L←L∪{A, A⁻}.

FIG. 2 illustrates configurations of fibers from different clumps where the similarity metric may indicate low similarity (e.g., close to 0 in an embodiment with similarity metrics between 0 and 1) indicating the fibers are unlikely to belong to the same clump. The cases shown in FIG. 2 are: (a) similar shapes but different locations (202); (b) similar locations but different shapes (204); (c) similar shapes and locations but different orientations (206).

A fiber might be represented in a data structure along with aspects of the fiber. Examples of aspects might include the fiber's starting location, shape, ending location, orientation, etc. Fibers might be deemed to be similar based on whether their aspects are comparable. For example, two fibers with the similar lengths that are similarly oriented and that are closely aligned might be considered to have a high similarity. A metric might provide a measure of similarity of two or more fibers, corresponding to comparing aspects of the fibers, such as their shapes and orientations. A similarity positioning of nodes in n-dimensional space might be constructed in memory in which the nodes correspond to fibers and edges of the node positionings correspond to pairwise similarity scores between fibers. A similarity positioning of nodes in n-dimensional space might be made sparse by omitting edges that correspond to pairs of fibers having a low similarity between them. A threshold for omitting edges might be whether a similarity metric is below a threshold or that a threshold number of edges are provided or a threshold number of nodes are included.

According to this metric, a pair of fibers would have a low similarity metric between then if they, for example, have some similar aspects but other aspects that are different, for example similar shapes but different locations, similar locations but different shapes, and/or similar shapes and locations, but different orientations. In an example, higher scores result when the points defining two fibers are close in distance and where the tangents are similar.

In this regard, a computing system may have a difficult time in differentiating between the similar shapes but different locations of 202, the similar locations but different shapes of 204, and/or the similar shapes and locations but different orientations of 206. Thus, an artist or other user may be required to individual identify if the fibers represented in 202, 204, and/or 206 are representative of the same clump within a groom or a different clump. For example, 202 may be identified as having the same shape parameters, but not location parameters, and thus may be mistakenly correlated by a computing system that does not adequately consider and weigh the difference in location of the fibers in 202 within vector space. Thus, a similarity graph, as disclosed herein, may be utilized in order to provide more accurate computational analysis of the fibers in FIG. 2 for purposes of clustering into clumps within a groom, as well as reduce computational resources and time in performing such analysis and clustering. One computation of clusters might then involve finding a relevant clustering of the similarity graph. This can be done using a spectral clustering technique or other methods.

In one embodiment, the fiber rendering system may compute a similarity metric between two fibers i and j by computing a Gaussian kernel, $W_{pos}$, and a parameter, $W_{dir}$, to account for differences in direction. Let $s_i = \{p_1^i, p_2^i, \ldots p_n^i\}$ and $s_j = \{p_1^j, p_2^j, \ldots p_n^j\}$ be the sequences of points that represent fibers i and j. For each point $p_k^i$, define $q_k^j$ to be the point on fiber $s_j$ closest to $p_k^i$. Then $t_k^i$ will denote the tangent at point $p_k^i$ and $v_k^j$ the tangent at point $q_k^j$. This similarity metric is a similarity score, $e_{i,j}$, and an example score computation is illustrated in Equation 1.

$$e_{i,j} = \frac{1}{n}\sum_{k=1}^{n} W_{pos}(p_k^i, q_k^j) W_{dir}(t_k^i, v_k^j). \qquad \text{(Eqn. 1)}$$

In Equation 1, the Gaussian kernel $W_{pos}$ penalizes differences in the aspects of shape or location (see FIG. 2, cases a 202 and b 204). An example kernel is illustrated in Equation 2.

$$W_{pos}(p, q) = \exp\left(-\frac{\|p-q\|^2}{R^2}\right). \qquad \text{(Eqn. 2)}$$

In Equation 1, the parameter $W_{dir}$ penalizes discrepancies in the orientation of the fibers (see FIG. 2, cases b 204 and c 206). An example component is illustrated in Equation 3.

$$W_{dir}(t,v) = \max(t \cdot v, 0)^2 \qquad \text{(Eqn. 3).}$$

The similarity score $e_1$ is thus a function of points and tangents of fibers, and thus the similarity score between two fibers is then a value of the similarity metric between the two fibers. The parameter, R, in Equation 2 may be selected according to the scale of the groom. It may be an artist-controllable parameter. In one embodiment, a typical hair model may user R=1 cm, or some other value, as an appropriate choice.

A similarity positioning of nodes in n-dimensional space can be represented in computer-readable form for processing where the nodes correspond to fibers and weights of edges between pairs of nodes are such that the weight of an edge between a pair of nodes corresponds to a similarity score of the fibers represented by the pair of nodes. A fully populated similarity positioning of those nodes might have a number of edges on the order of the number of nodes squared, which may be difficult to store in memory or to process efficiently by a computing system. To ameliorate this, the fiber rendering system may prune the similarity positioning of nodes in n-dimensional space and keep only a fixed number K of edges per fiber, causing the nodes to only have a maximum number, K, of nonzero edges. K might be an artist-controllable parameter or may be determined based on other factors, such as size of the groom and/or fibers within the groom, other groom parameters, parameters of the scene and/or characters in the scene, and other factors designating the overall animation quality, size, pixel value, and the like of the groom. The edges might be pruned based on their weights, such as keeping the highest K weights and setting all others to zero. Examples for K might be 10 or 20 or some other number, which may be selected by an artist or depending on computational resources and parameters of the groom. Choosing a fixed number of edges per fiber makes the positioning of nodes in n-dimensional space sparse and ensures the subsequent clustering step remains computationally efficient. Using the K edges with the highest similarity scores may produce the most useful clumps, which will be those clumps with fibers having similar location, shape, and orientation.

In one embodiment, the fiber rendering system may use spectral clustering for splitting the weighted similarity positioning of nodes in n-dimensional space into representative (meaning strongly-connected) components. Each split has a cut between two portions of the cluster being split. Spectral clustering techniques generally rely on computing an alternative representation of the positioning vertices using the eigenvectors of the graph Laplacian (hence the name spectral). Different versions of the spectral clustering may differ in how this representation is used to extract relevant clusters.

In some embodiments, a cut value may be computed for a given weighted positioning of nodes in n-dimensional space and a proposed partition of this positioning into two sub-portions or sub-representations of the positioning in n-dimensional space. For some cut value computations, the cut value provides a good heuristic for estimating a quality of the partition, where low cut values indicate that two clusters are of similar sizes, and that only a few edges associated with low scores are split across them. A clustering that minimizes the cut value might be considered an optimal clustering.

An indicator function might be used in computing the optimal cut value, which might be used in a process to more efficiently compute the optimal cut value. In one approach, the optimal cut can be found by computing its associated indicator function instead. As finding the optimal indicator function that minimizes the indicator function value can be a NP-hard problem, one approach is to have the processor solve a relaxed problem instead, which may save considerable computing resources and time. The relaxed problem may include minimizing the indicator function value or ranges of values and projecting onto a more constrained space. It is usually much easier to solve the relaxed problem and that may give a good approximation of the solution to the original problem. In order to avoid the trivial solutions of a constant or very small values, some added constraints might be provided.

In one embodiment, the fiber rendering system may use the spectral clustering method to iteratively cut the positioning of nodes in n-dimensional space into smaller and smaller clusters until a final number of clusters is reached, which are then identified as the clumps for input into an animation system.

Consider a weighted positioning of nodes in n-dimensional space $\mathcal{G} = (V, E)$ with vertices V and edges $E=\{e_{i,j}|(i, j)\in V^2\}$ such that $e_{i,j} \geq 0 \; \forall (i, j) \in V^2$. A cut is a partition of the vertices V into 2 disjoint subsets $\{A, \overline{A}\}$. The value of a cut is given as in Equation 4.

$$C(A, \overline{A}) = \sum_{i \in A, j \in \overline{A}} e_{i,j}\left(\frac{1}{|A|} + \frac{1}{|\overline{A}|}\right). \quad \text{(Eqn. 4)}$$

The fiber rendering system may use the value C as a good heuristic for estimating the quality of the clusters $\{A, \overline{A}\}$. Low values indicate that the two clusters are of similar sizes and that only a few edges associated with low scores are split across them, hence an optimal clustering is one that minimizes the cut value.

FIG. 3 illustrates two different clustering cut examples: (a) a poor quality cut 302 and (b) a good quality cut 304. Good quality cut 304 preserves the main structures better, as it produces fewer split edges (in red). This is indicated by its lower cut value.

The indicator function $f=\{f_i, i \in V\}$ of a cut $\{A, \overline{A}\}$ might be defined as in Equation 5.

$$f_i = \begin{cases} 1 & \text{if } i \in A \\ -1 & \text{if } i \in \overline{A} \end{cases}. \quad \text{(Eqn. 5)}$$

The value of a cut can be defined in terms of the indicator function as illustrated in Equation 6.

$$C(f) = \sum_{(i,j)\in V^2} e_{i,j}(f_i - f_j)^2\left(\frac{1}{|V|+S} + \frac{1}{|V|-S}\right), S = \sum_{k \in V} f_k \quad \text{(Eqn. 6)}$$

Equation 6 might be expressed and/or represented in memory in matrix form, as in Equation 7, where L is the Laplacian of the similarity graph.

$$C(f) = f^T L f \quad \text{(Eqn. 7)}$$

Thus the optimal cut can be found by computing its associated indicator function instead. In some embodiments, a brute force approach may be used, though finding the optimal indicator function that minimizes Equation 6 might be an NP-hard computational problem.

To improve the efficiency of the fiber rendering system, the spectral clustering method may instead solve a relaxed version of Equation 6. The relaxed problem might comprise minimizing Equation 6 for any $f$, meaning $f$ is allowed to take any real value and not just $-1$ or $1$. Then, in a following step, the relaxed solution is projected onto the $\{-1; 1\}$ space. In constrained optimisation problems, it may be computationally easier to solve the relaxed problem, which may result in a good approximation of the solution to the original (constrained) problem.

In order to avoid the trivial solutions of a constant or very small $f$, the fiber rendering system may incorporate additional constraints in the relaxed problem. The trivial solutions may be avoided with the following constraints specified in Equations 8 and 9, for example.

$$\|f\|=1 \quad \text{(Eqn. 8)}$$

$$\Sigma_{k \in V} f_k = 0 \quad \text{(Eqn. 9)}$$

The minimization of Equation 6 under the constraint of Equation 8 can be considered to be equivalent to finding the eigenvector associated to the minimum eigenvalue of the Laplacian of the similarity graph. The minimum eigenvalue of the graph Laplacian is 0 and its associated eigenvector $E_0$ is constant (a trivial solution). Adding constraint of Equation 9, the problem now becomes finding the second minimum eigenvalue of the graph Laplacian and its associated eigenvector $E_1$ (the first non-trivial eigenvector).

Figure 4:
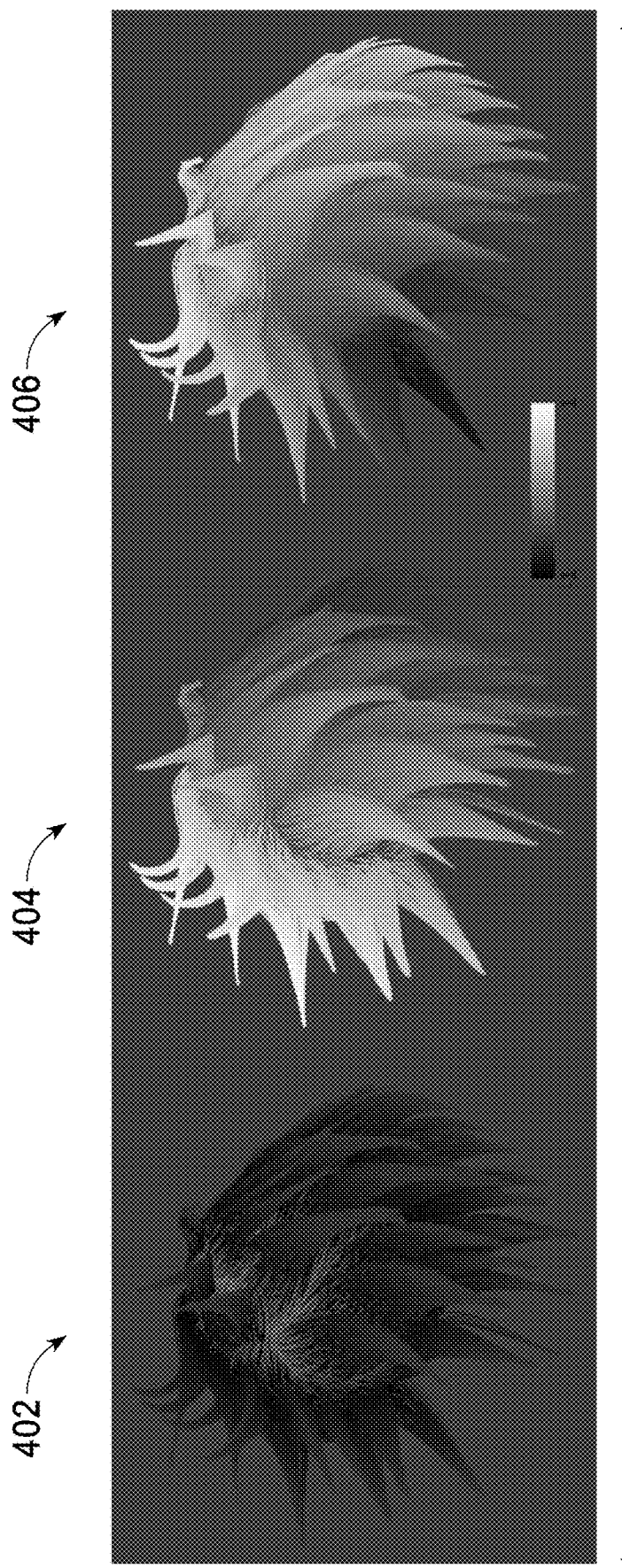
FIG. 4 illustrates a groom and its first and second non-trivial eigenvectors in accordance with an embodiment.

FIG. 4 shows a simple groom model 402 (left). Element 404 (center) shows the first non-trivial eigenvector $E_1$ of the Laplacian of the similarity graph. Element 406 (right) shows the $2^{nd}$ non-trivial eigenvector $E_2$. Components of the eigenvectors might "jump" across clumps, making their identification easier. A sample solution to the relaxed problem in element 404 (center) shows a nearly constant value for each clump, which helps identifying some of them. Many neighbor clumps might be assigned the same value, making it difficult to define two separate clusters. Using a few additional eigenvectors $E_2$, $E_3$, ... (in one embodiment, perhaps two or three, or more, in total) may help with the computation of the final partition, as shown by element 406 (right).

To extract the final 2-clusters partition, the fiber rendering system considers the space defined by the coordinates of the first k non-trivial eigenvectors $E_1$, $E_2$, ..., $E_k$ of the graph Laplacian (typically k=2 or k=3). For each node within the positioning (in n-dimensional space) $i \in V$, the fiber rendering system computes a new point $x_i$ using the components of $E_1 = (E_1^1, E_1^2, E_1^3, \ldots)$, $E_2 = (E_2^1, E_2^2, E_2^3, \ldots)$, ..., $E_k = (E_k^1, E_k^2, E_k^3, \ldots)$ as in Equation 10.

$$x_1 = \begin{pmatrix} E_1^1 \\ E_2^1 \\ \vdots \\ E_k^1 \end{pmatrix}, x_2 = \begin{pmatrix} E_1^2 \\ E_2^2 \\ \vdots \\ E_k^2 \end{pmatrix}, x_3 = \begin{pmatrix} E_1^3 \\ E_2^3 \\ \vdots \\ E_k^3 \end{pmatrix}, \ldots \quad \text{(Eqn. 10)}$$

Figure 5:
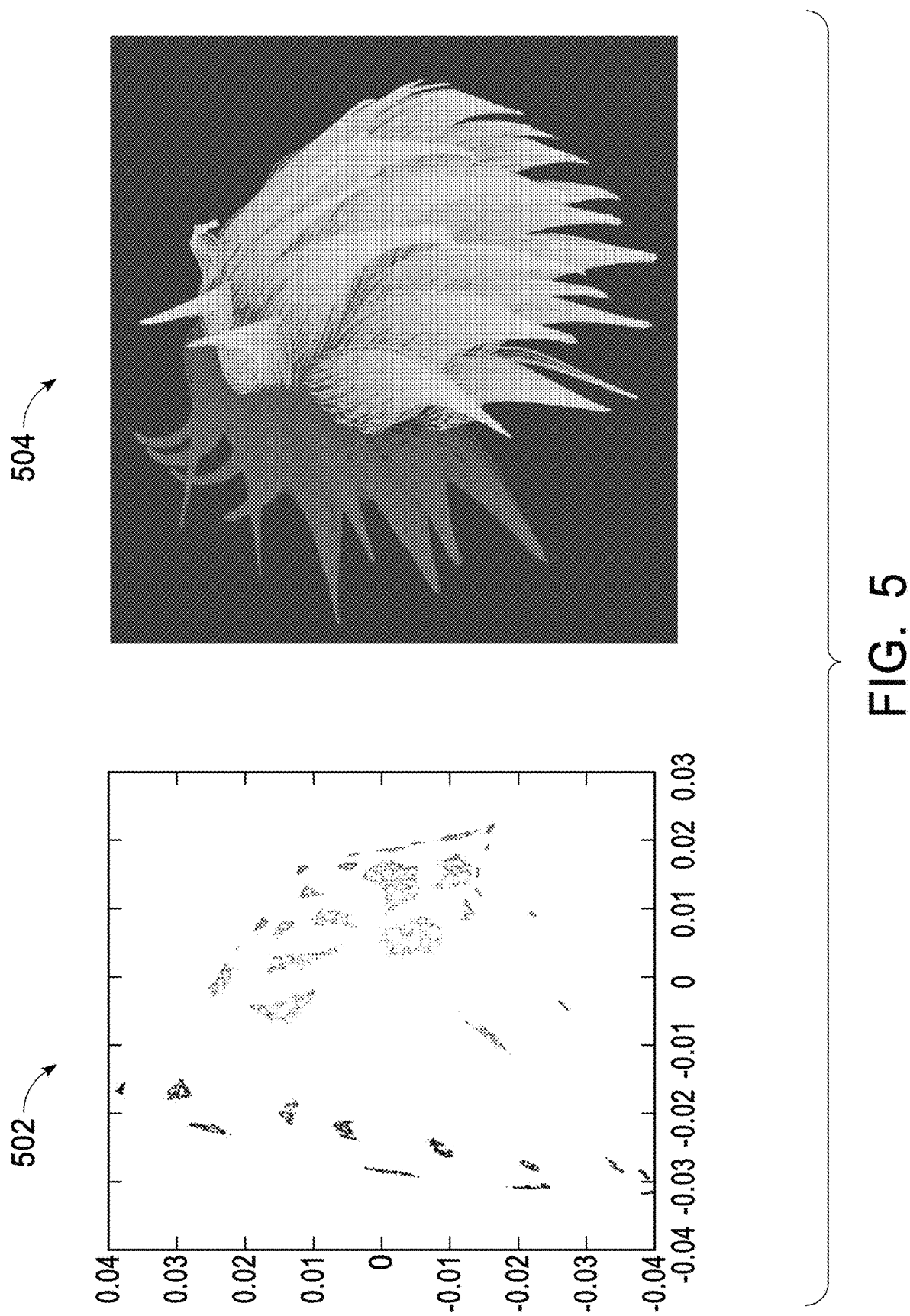
FIG. 5 illustrates a plot of eigenvectors and a corresponding cut in accordance with an embodiment.

An example of such a representation is given in FIG. 5. It is computationally more efficient to extract relevant clusters in this space, due to the properties of the graph Laplacian's eigenvectors. In FIG. 5, positioning of nodes in n-dimensional space 502, the groom from FIG. 4 is plotted using the values of the two eigenvectors as 2D coordinates, with each point corresponding to a single fiber. The structure of the individual clumps clearly appears in positioning of nodes in n-dimensional space 502. Element 504 shows the corresponding cut on the groom of FIG. 4.

In some cases, recovering the clusters may be accomplished using K-means, for example when clusters are well-defined such as the model groom from FIGS. 4 and 5. However, in realistic grooms where clumps partially blend into each other, the clusters may not be well-defined in the space of the eigenvectors' coordinates. There are two reasons for this. The first reason is that individual clumps may not have a convex (or close to convex) shape in the space of the eigenvector coordinates. Non-convex cluster shapes are generally not recovered by the K-means algorithm. The second reason is that, while neighbor clumps are usually well-separated in the space of the eigenvector coordinates, clumps that are distant from each other may overlap. K-means is generally not able to distinguish overlapping clusters.

Figure 6:
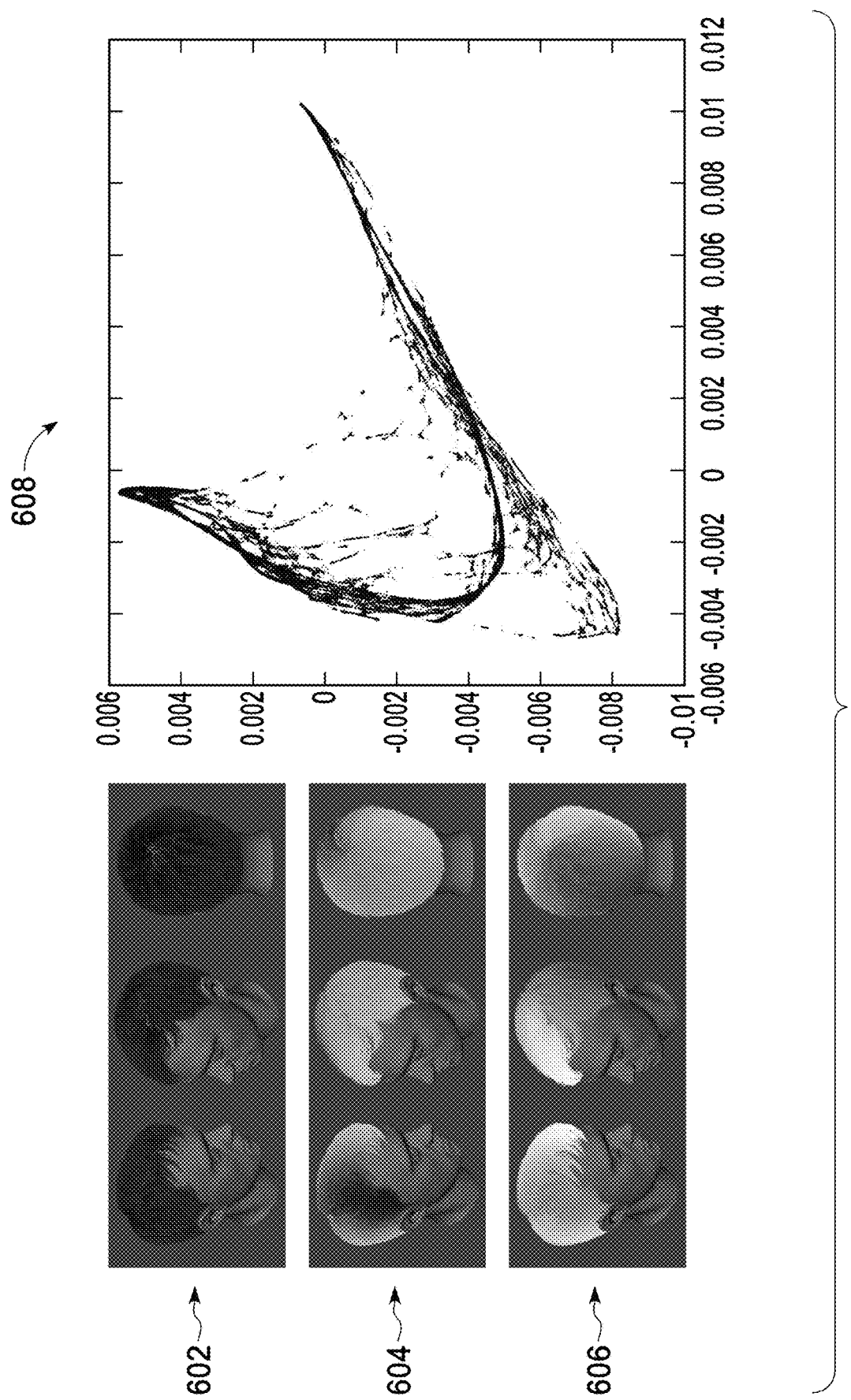
FIG. 6 illustrates a groom, its first and second eigenvectors, and a positioning of those eigenvector coordinates in n-dimensional space in accordance with an embodiment.

FIG. 6 shows an example case of a realistic groom model 602. Elements 604 and 606 illustrate the first two eigenvectors $E_1$ (604, middle) and $E_2$ (606, bottom) of the Laplacian of the corresponding similarity graph. The groom fibers were plotted using these two eigenvector coordinates in eigenvector coordinates 608. In this regard, where clusters are well defined, K-means clustering may be used with sufficiently good results to identify clumps of fibers through spectral clustering, as shown in FIG. 5. However, In grooms where non-convex shapes may be used and/or distance shapes may overlap in a resulting plot of their nodes from spectral clustering, fibers and clusters of fibers may overlap, which may lead to difficulties in utilising K-means clustering. Even though the individual clumps are fairly noticeable in the groom model itself 602, it might be difficult to identify most of them in the space of the eigenvector coordinates 608, in some instances. Extracting the final clustering might be more easily accomplished by a more robust method than K-means. This allows a computer animation system to more robustly and accurately detect clumps of fibers in a virtual animation of a groom, while reducing computational resource and time in performing such detections and clustering.

To more robustly cluster fibers, the fiber rendering system may embed the whole similarity positioning of nodes in n-dimensional space $\mathcal{G}$ into the space of the eigenvector coordinates, not just the vertices V. By using the connectivity of $\mathcal{G}$, the fiber rendering system may more readily distinguish overlapping clumps.

The embedded positioning of nodes in n-dimensional space $\mathcal{G}' = (V', E')$ has vertices $V' = \{x_1, x_2, \ldots x_n\}$ and edges $E' = \{e_{i,j}' | (i, j) \in V^2\}$ with $e_{i,j}' = \|x_i - x_j\|$. The fiber rendering system uses the embedded vertices $\{x_i\}$ and re-weights the original non-zero edges of the similarity positioning of nodes in n-dimensional space according to the Euclidean distance between the $x_i$.

The method for robustly extracting the two final clusters works might be implemented by a processor performing the steps below, or program code representing pseudocode expressions in an embodiment:

1. Identify a representative vertex for each of the two final clusters. These could be the vertices of min and max coordinates in the first non-trivial eigenvector $E_1$, as they should be far away from each other. Note them as a and b.
2. Initialize a set $S_i = \{i\}$ for each vertex $i \in V$.
3. Sort the edges E' according to their Euclidean length $e_{i,j}'$ (shortest first).
4. While E' is not empty, repeat steps 5 to 7.
5. Pick the next shortest edge $\{i, j\} \in E'$ and remove it from E'.
6. If $S_i \neq S_j$ and ($a \notin S_i \cup S_j$ or $b \notin S_i \cup S_j$):
7. Perform the operation $\forall k \in S_i \cup S_j : S_k \leftarrow S_i \cup S_j$.

Figure 7:
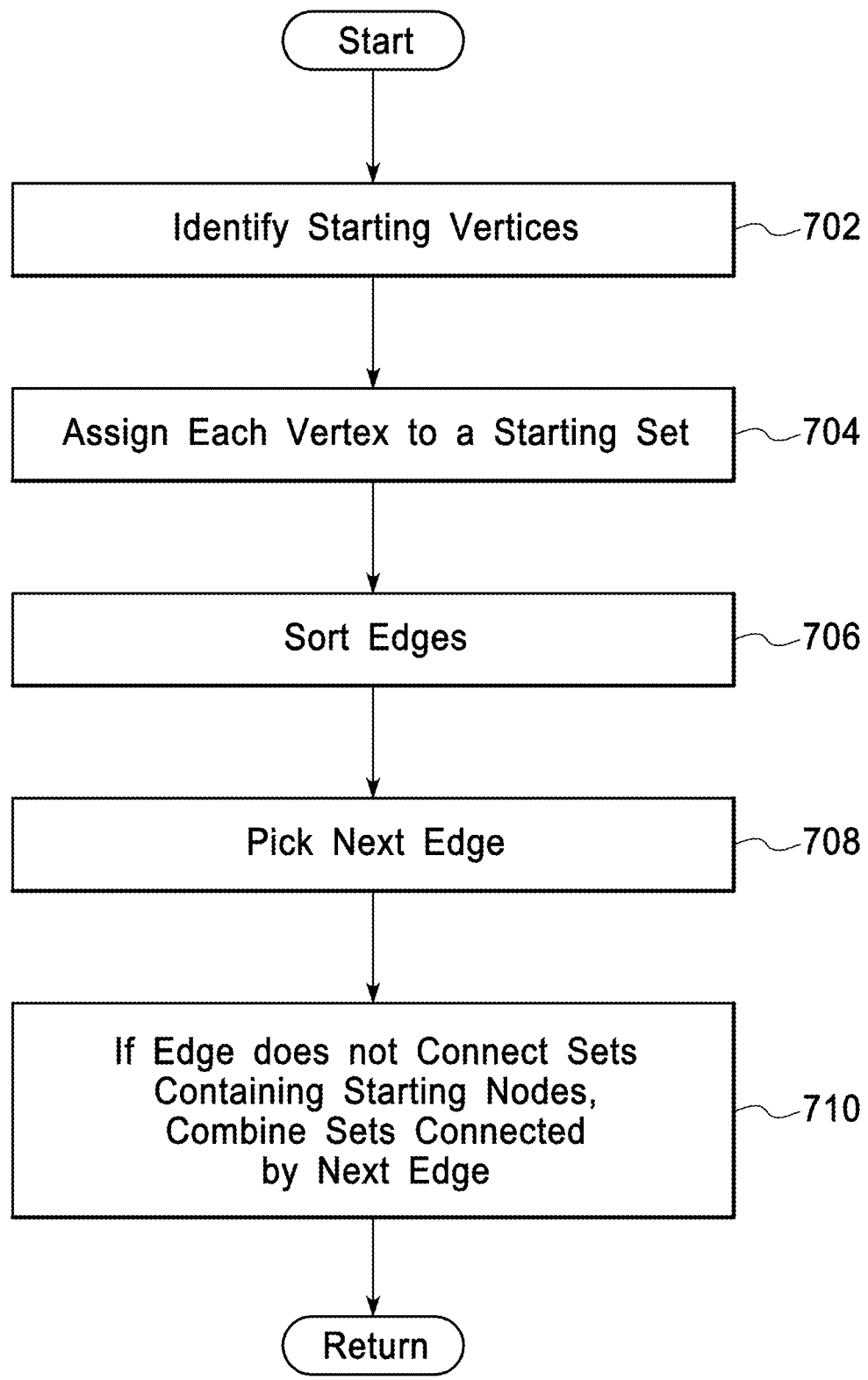
FIG. 7 illustrates a block diagram of a method of partitioning a cluster in accordance with an embodiment.

One method for robustly extracting two final clusters is shown in FIG. 7. Note that one or more steps, processes, and methods described herein of FIG. 1 may be omitted, performed in a different sequence, or combined as desired or appropriate.

In step 702, starting vertices are noted. These vertices may be initial vertices that should not be combined into the same set. In one embodiment, min and max vertices are noted as a and b, corresponding to vertices having the min and max of a non-trivial eigenvector, such as the first. In step 704, each vertex is assigned to a starting set. In one embodiment, each vertex may be assigned to a set having one member. In step 706, the edges between the vertices are sorted by, in an embodiment, Euclidian length, though other sorting criteria are contemplated. In step 708, the next edge is selected, until no more edges remain. In one embodiment, the next edge selected may be the shortest edge. In step 710, if the selected edge does not connect the sets containing a and b, the sets containing the vertices connected by the selected edge are combined. Once all edges have been selected, the method exits.

Figure 8:
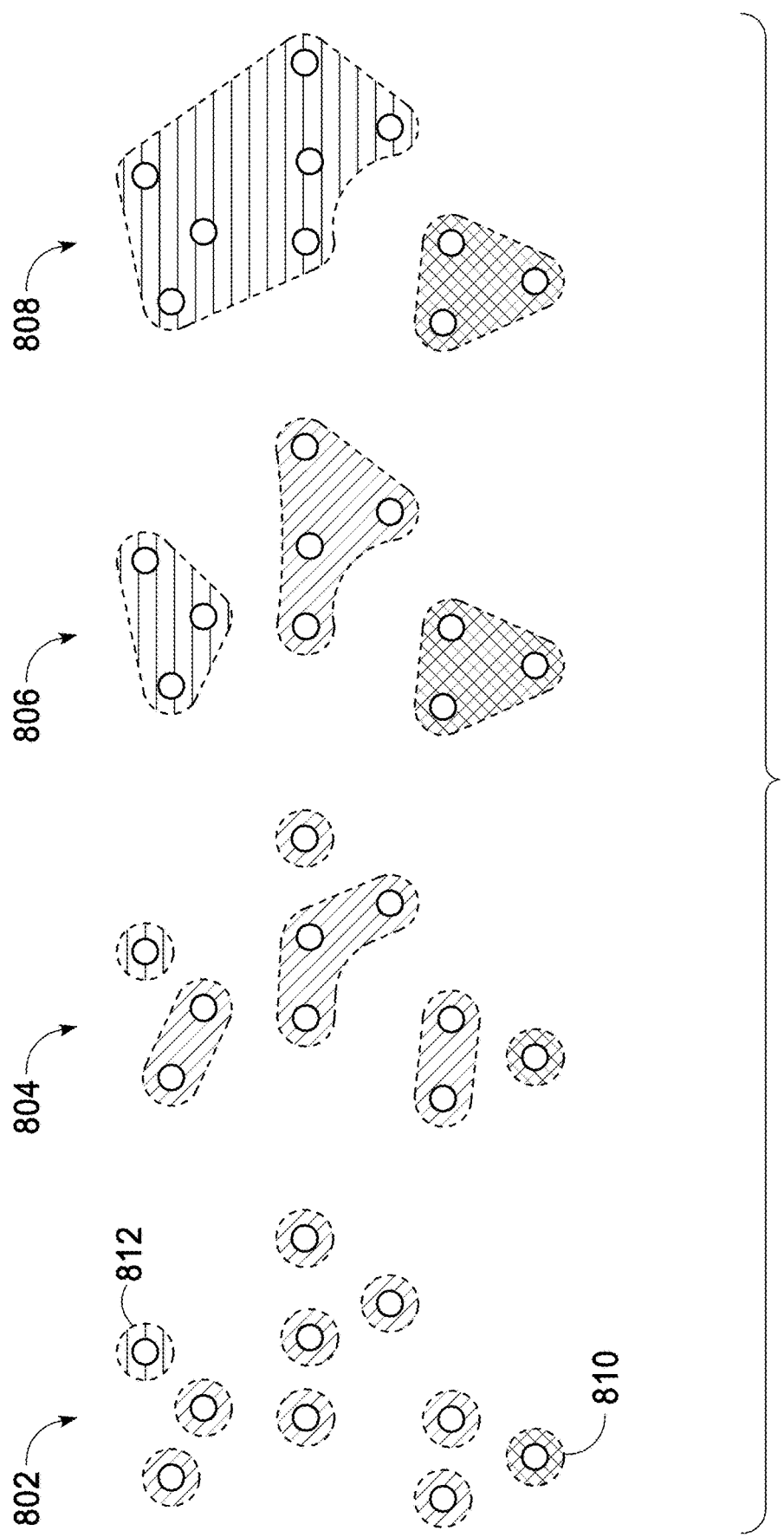
FIG. 8 illustrates a sequence of sets as a partition is constructed in accordance with an embodiment.

FIG. 8 illustrates the sequence sets as the method of computing the final partition is executed. A set having one member (shown by dashed lines) is created for each vertex of the embedded positioning of nodes in n-dimensional space in 802. Edges are sorted by length (shortest first), then the sets corresponding to the vertices of each edges are iteratively fused together (proceeding to 804 then 806) until there are only two sets remaining in 808. During the procedure, the method keeps track of node 810 having the min coordinates and node 812 having the max coordinates, ignoring any edge that would fuse their corresponding sets.

Since the method iteratively merges pairs of sets, all the intermediate sets can be structured into a binary tree. Rather than explicitly merging the sets at each step, the method may result in creation of a binary tree node whose children are the corresponding subsets. This makes the method run in linear time on the order of the number of edges, which can be computationally much faster than K-means using a computer animation system when animating and clustering fibers within a virtual animation of a groom of fibers.

Some results of the full spectral clump detection technique applied to sample grooms are given in FIG. 9. The method identifies relevant clumps successfully, even in the more complex cases. The groom from FIG. 4 with 40 clumps extracted is shown in 902. The groom from FIG. 6 with 300 clumps extracted is shown in 904. Thus, more complex and realistic grooms of fibers may be clustered by a computer animation system utilising these methods, while retaining computational accuracy, resources, and time.

Figure 10:
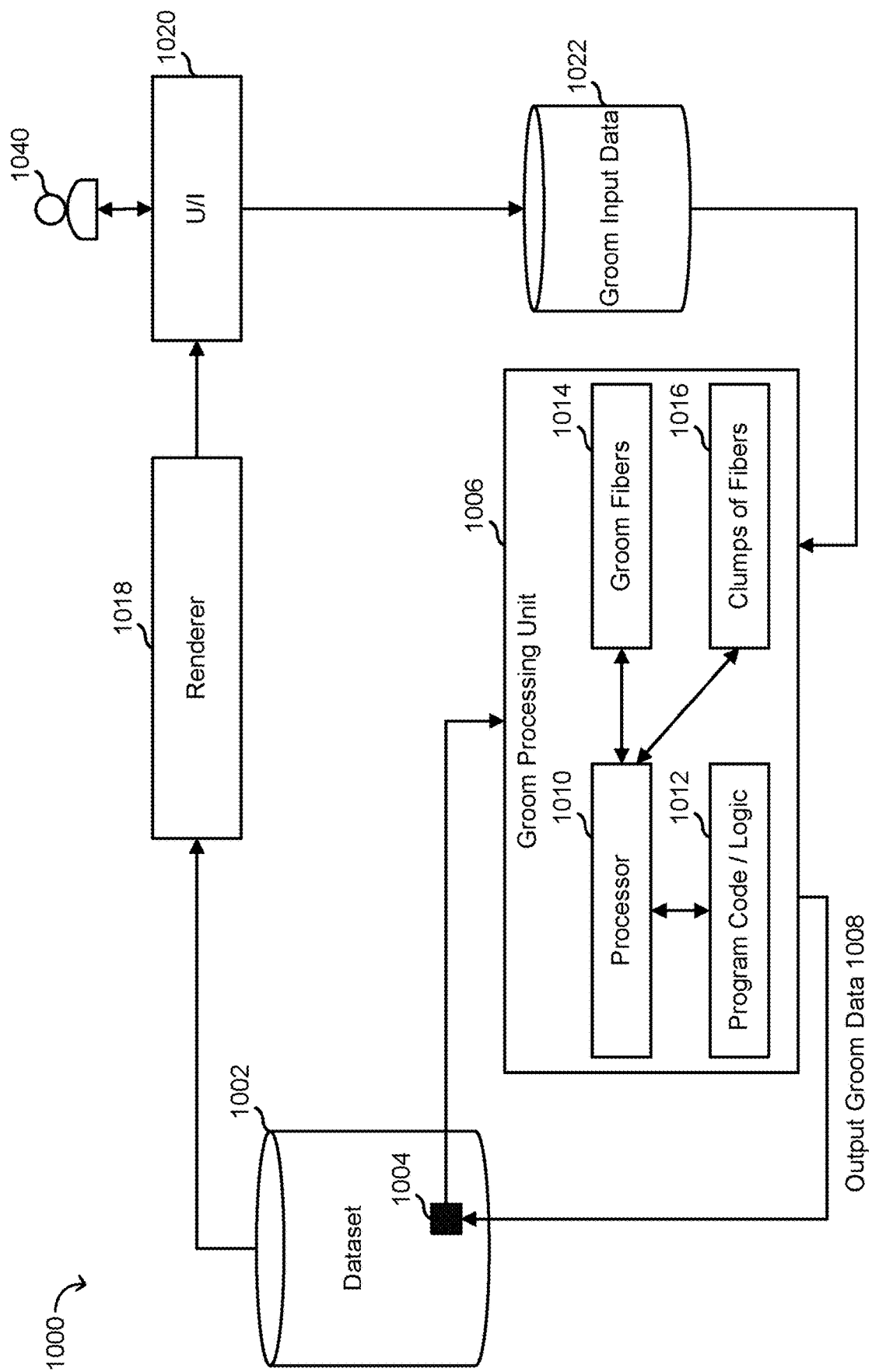
FIG. 10 illustrates a system for utilising clumps of fibers that have been clustered within a computer animation in accordance with an embodiment.

FIG. 10 illustrates a system for utilising clumps of fibers that have been clustered within a computer animation, in an embodiment. The system includes a dataset 1002, a groom processing unit 1006, a renderer 1018, a user interface (UI) 1020, and a input groom data 1022.

A user 1040 may interact with the UI 1020 to access, load, and/or define one or more grooms of fibers, such as an object having fibers defined by curves, objects, splines, or the within the groom. The groom may therefore be pre-generated or may be generated by user 1040 when performing the clumping methods and processes described herein. Input groom data 1022 may indicate, for example, the criteria for the groom and the clumping of the fibers within the from, such as stored grooms and/or parameters for generating and animating a groom. Input groom data 1022 may include, for example, a threshold or number of clumps to be identified in a selected groom, although automated techniques may also be used depending on groom size, resolution, scene placement, and the like. Dataset 1002 may store data for different fibers and grooms that may be stored and/or loaded, such as characters, creatures, or objects. Dataset 1002 may be loaded with data from a source of an animation, such as a tessellated mesh, subdivision surface, or the like used to define a groom or other object of fibers (e.g., a pelt, coat, robe, cloak, etc.).

Groom processing unit 1006 may utilize the methods and processes described herein to take input groom data 1022 with any additional groom data from dataset 1002, and perform the clumping operations herein to cluster fibers within the groom into specific clumps, thereby more easily animating the fibers according to a shared or common parameter of the fiber within each clump. The groom processing unit 1006 may clump fibers by using the similarity metric and scores, as described herein. Further, clusters of fibers may then be split to smaller clusters to a predetermined threshold, such as an artist-defined number of clusters, using the additional spectral clustering and robust partitioning methods and processed, as described herein.

Groom processing unit 1006 includes a processor 1010 that executes program code 1012 to cluster fibers and partition those clusters from groom fibers 1014 to clumps of fibers 1016. Groom processing unit 1006 may further groom output data 1008 to dataset 1002 so that the corresponding clumps of fibers 1016 from groom fibers 1014 may be stored for later use, such as with renderer 1018 when rendering a scene having the groom. For example, groom processing unit 1006 may initiate the process by taking input groom data 1022 with any additional data from dataset 1002, and thereafter determining clumps of fibers 1016 through similarity scores and one or more partitioning techniques of fiber nodes as represented in a particular vector space. Based on clumps of fibers 1016, groom processing unit 1006 may then provide any groom and clumping data as groom output data 1008 for storage by dataset 1002. This allows for reproduction of the corresponding groom, clumps, and/or animation parameters based on clumps of fibers 1016. Groom processing unit 1006 may then move to the next groom designated by user 1040 and further perform additional clumping as requested. The resulting grooms, clusters, fibers, and the like that have been animated and stored by dataset 1002 may further be rendered by rendered 1018 and/or output to user 1040 to inspect the results.

Figure 11:
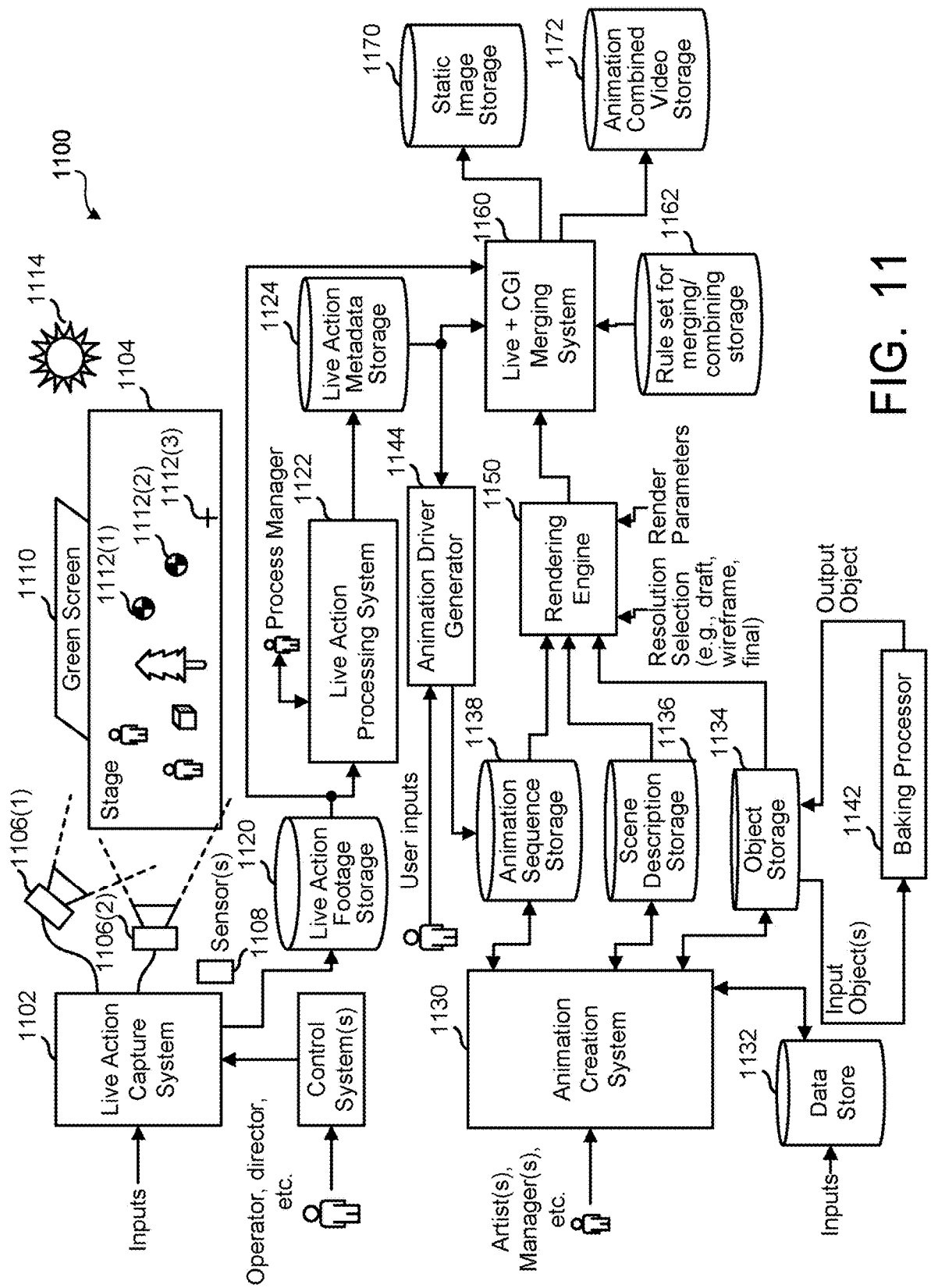
FIG. 11 illustrates an example visual content generation system as might be used to generate imagery in the form of still images and/or video sequences of images in accordance with an embodiment.

For example, FIG. 11 illustrates the example visual content generation system 1100 as might be used to generate imagery in the form of still images and/or video sequences of images. Visual content generation system 1100 might generate imagery of live action scenes, computer generated scenes, or a combination thereof. In a practical system, users are provided with tools that allow them to specify, at high levels and low levels where necessary, what is to go into that imagery. For example, a user might be an animation artist and might use visual content generation system 1100 to capture interaction between two human actors performing live on a sound stage and replace one of the human actors with a computer-generated anthropomorphic non-human being that behaves in ways that mimic the replaced human actor's movements and mannerisms, and then add in a third computer-generated character and background scene elements that are computer-generated, all in order to tell a desired story or generate desired imagery.

Still images that are output by visual content generation system 1100 might be represented in computer memory as pixel arrays, such as a two-dimensional array of pixel color values, each associated with a pixel having a position in a two-dimensional image array. Pixel color values might be represented by three or more (or fewer) color values per pixel, such as a red value, a green value, and a blue value (e.g., in RGB format). Dimensions of such a two-dimensional array of pixel color values might correspond to a preferred and/or standard display scheme, such as 1920-pixel columns by 1280-pixel rows or 4096-pixel columns by 2160-pixel rows, or some other resolution. Images might or might not be stored in a compressed format, but either way, a desired image may be represented as a two-dimensional array of pixel color values. In another variation, images are represented by a pair of stereo images for three-dimensional presentations and in other variations, an image output, or a portion thereof, might represent three-dimensional imagery instead of just two-dimensional views. In yet other embodiments, pixel values are data structures and a pixel value is associated with a pixel and can be a scalar value, a vector, or another data structure associated with a corresponding pixel. That pixel value might include color values, or not, and might include depth values, alpha values, weight values, object identifiers or other pixel value components.

A stored video sequence might include a plurality of images such as the still images described above, but where each image of the plurality of images has a place in a timing sequence and the stored video sequence is arranged so that when each image is displayed in order, at a time indicated by the timing sequence, the display presents what appears to be moving and/or changing imagery. In one representation, each image of the plurality of images is a video frame having a specified frame number that corresponds to an amount of time that would elapse from when a video sequence begins playing until that specified frame is displayed. A frame rate might be used to describe how many frames of the stored video sequence are displayed per unit time. Example video sequences might include 24 frames per second (24 FPS), 50 FPS, 140 FPS, or other frame rates. In some embodiments, frames are interlaced or otherwise presented for display, but for clarity of description, in some examples, it is assumed that a video frame has one specified display time, but other variations might be contemplated.

One method of creating a video sequence is to simply use a video camera to record a live action scene, i.e., events that physically occur and can be recorded by a video camera. The events being recorded can be events to be interpreted as viewed (such as seeing two human actors talk to each other) and/or can include events to be interpreted differently due to clever camera operations (such as moving actors about a stage to make one appear larger than the other despite the actors actually being of similar build, or using miniature objects with other miniature objects so as to be interpreted as a scene containing life-sized objects).

Creating video sequences for story-telling or other purposes often calls for scenes that cannot be created with live actors, such as a talking tree, an anthropomorphic object, space battles, and the like. Such video sequences might be generated computationally rather than capturing light from live scenes. In some instances, an entirety of a video sequence might be generated computationally, as in the case of a computer-animated feature film. In some video sequences, it is desirable to have some computer-generated imagery and some live action, perhaps with some careful merging of the two.

While computer-generated imagery might be creatable by manually specifying each color value for each pixel in each frame, this is likely too tedious to be practical. As a result, a creator uses various tools to specify the imagery at a higher level. As an example, an artist might specify the positions in a scene space, such as a three-dimensional coordinate system, of objects and/or lighting, as well as a camera viewpoint, and a camera view plane. From that, a rendering engine could take all of those as inputs, and compute each of the pixel color values in each of the frames. In another example, an artist specifies position and movement of an articulated object having some specified texture rather than specifying the color of each pixel representing that articulated object in each frame.

In a specific example, a rendering engine performs ray tracing wherein a pixel color value is determined by computing which objects lie along a ray traced in the scene space from the camera viewpoint through a point or portion of the camera view plane that corresponds to that pixel. For example, a camera view plane might be represented as a rectangle having a position in the scene space that is divided into a grid corresponding to the pixels of the ultimate image to be generated, and if a ray defined by the camera viewpoint in the scene space and a given pixel in that grid first intersects a solid, opaque, blue object, that given pixel is assigned the color blue. Of course, for modern computer-generated imagery, determining pixel colors—and thereby generating imagery—can be more complicated, as there are lighting issues, reflections, interpolations, and other considerations.

As illustrated in FIG. 11, a live action capture system 1102 captures a live scene that plays out on a stage 1104. Live action capture system 1102 is described herein in greater detail, but might include computer processing capabilities, image processing capabilities, one or more processors, program code storage for storing program instructions executable by the one or more processors, as well as user input devices and user output devices, not all of which are shown.

In a specific live action capture system, cameras 1106(1) and 1106(2) capture the scene, while in some systems, there might be other sensor(s) 1108 that capture information from the live scene (e.g., infrared cameras, infrared sensors, motion capture ("mo-cap") detectors, etc.). On stage 1104, there might be human actors, animal actors, inanimate objects, background objects, and possibly an object such as a green screen 1110 that is designed to be captured in a live scene recording in such a way that it is easily overlaid with computer-generated imagery. Stage 1104 might also contain objects that serve as fiducials, such as fiducials 1112(1)-(3), that might be used post-capture to determine where an object was during capture. A live action scene might be illuminated by one or more lights, such as an overhead light 1114.

During or following the capture of a live action scene, live action capture system 1102 might output live action footage to a live action footage storage 1120. A live action processing system 1122 might process live action footage to generate data about that live action footage and store that data into a live action metadata storage 1124. Live action processing system 1122 might include computer processing capabilities, image processing capabilities, one or more processors, program code storage for storing program instructions executable by the one or more processors, as well as user input devices and user output devices, not all of which are shown. Live action processing system 1122 might process live action footage to determine boundaries of objects in a frame or multiple frames, determine locations of objects in a live action scene, where a camera was relative to some action, distances between moving objects and fiducials, etc. Where elements have sensors attached to them or are detected, the metadata might include location, color, and intensity of overhead light 1114, as that might be useful in post-processing to match computer-generated lighting on objects that are computer-generated and overlaid on the live action footage. Live action processing system 1122 might operate autonomously, perhaps based on predetermined program instructions, to generate and output the live action metadata upon receiving and inputting the live action footage. The live action footage can be camera-captured data as well as data from other sensors.

An animation creation system 1130 is another part of visual content generation system 1100. Animation creation system 1130 might include computer processing capabilities, image processing capabilities, one or more processors, program code storage for storing program instructions executable by the one or more processors, as well as user input devices and user output devices, not all of which are shown. Animation creation system 1130 might be used by animation artists, managers, and others to specify details, perhaps programmatically and/or interactively, of imagery to be generated. From user input and data from a database or other data source, indicated as a data store 1132, animation creation system 1130 might generate and output data representing objects (e.g., a horse, a human, a ball, a teapot, a cloud, a light source, a texture, etc.) to an object storage 1134, generate and output data representing a scene into a scene description storage 1136, and/or generate and output data representing animation sequences to an animation sequence storage 1138.

Scene data might indicate locations of objects and other visual elements, values of their parameters, lighting, camera location, camera view plane, and other details that a rendering engine 1150 might use to render CGI imagery. For example, scene data might include the locations of several articulated characters, background objects, lighting, etc. specified in a two-dimensional space, three-dimensional space, or other dimensional space (such as a 2.5-dimensional space, three-quarter dimensions, pseudo-3D spaces, etc.) along with locations of a camera viewpoint and view place from which to render imagery. For example, scene data might indicate that there is to be a red, fuzzy, talking dog in the right half of a video and a stationary tree in the left half of the video, all illuminated by a bright point light source that is above and behind the camera viewpoint. In some cases, the camera viewpoint is not explicit, but can be determined from a viewing frustum. In the case of imagery that is to be rendered to a rectangular view, the frustum would be a truncated pyramid. Other shapes for a rendered view are possible and the camera view plane could be different for different shapes.

Animation creation system 1130 might be interactive, allowing a user to read in animation sequences, scene descriptions, object details, etc. and edit those, possibly returning them to storage to update or replace existing data. As an example, an operator might read in objects from object storage into a baking processor 1142 that would transform those objects into simpler forms and return those to object storage 1134 as new or different objects. For example, an operator might read in an object that has dozens of specified parameters (movable joints, color options, textures, etc.), select some values for those parameters and then save a baked object that is a simplified object with now fixed values for those parameters.

Rather than requiring user specification of each detail of a scene, data from data store 1132 might be used to drive object presentation. For example, if an artist is creating an animation of a spaceship passing over the surface of the Earth, instead of manually drawing or specifying a coastline, the artist might specify that animation creation system 1130 is to read data from data store 1132 in a file containing coordinates of Earth coastlines and generate background elements of a scene using that coastline data.

Animation sequence data might be in the form of time series of data for control points of an object that has attributes that are controllable. For example, an object might be a humanoid character with limbs and joints that are movable in manners similar to typical human movements. An artist can specify an animation sequence at a high level, such as "the left hand moves from location (X1, Y1, Z1) to (X2, Y2, Z2) over time T1 to T2", at a lower level (e.g., "move the elbow joint 2.5 degrees per frame") or even at a very high level (e.g., "character A should move, consistent with the laws of physics that are given for this scene, from point P1 to point P2 along a specified path").

Animation sequences in an animated scene might be specified by what happens in a live action scene. An animation driver generator 1144 might read in live action metadata, such as data representing movements and positions of body parts of a live actor during a live action scene. Animation driver generator 1144 might generate corresponding animation parameters to be stored in animation sequence storage 1138 for use in animating a CGI object. This can be useful where a live action scene of a human actor is captured while wearing mo-cap fiducials (e.g., high-contrast markers outside actor clothing, high-visibility paint on actor skin, face, etc.) and the movement of those fiducials is determined by live action processing system 1122. Animation driver generator 1144 might convert that movement data into specifications of how joints of an articulated CGI character are to move over time.

A rendering engine 1150 can read in animation sequences, scene descriptions, and object details, as well as rendering engine control inputs, such as a resolution selection and a set of rendering parameters. Resolution selection might be useful for an operator to control a trade-off between speed of rendering and clarity of detail, as speed might be more important than clarity for a movie maker to test some interaction or direction, while clarity might be more important than speed for a movie maker to generate data that will be used for final prints of feature films to be distributed. Rendering engine 1150 might include computer processing capabilities, image processing capabilities, one or more processors, program code storage for storing program instructions executable by the one or more processors, as well as user input devices and user output devices, not all of which are shown.

Visual content generation system 1100 can also include a merging system 1160 that merges live footage with animated content. The live footage might be obtained and input by reading from live action footage storage 1120 to obtain live action footage, by reading from live action metadata storage 1124 to obtain details such as presumed segmentation in captured images segmenting objects in a live action scene from their background (perhaps aided by the fact that green screen 1110 was part of the live action scene), and by obtaining CGI imagery from rendering engine 1150.

A merging system 1160 might also read data from rulesets for merging/combining storage 1162. A very simple example of a rule in a ruleset might be "obtain a full image including a two-dimensional pixel array from live footage, obtain a full image including a two-dimensional pixel array from rendering engine 1150, and output an image where each pixel is a corresponding pixel from rendering engine 1150 when the corresponding pixel in the live footage is a specific color of green, otherwise output a pixel value from the corresponding pixel in the live footage."

Merging system 1160 might include computer processing capabilities, image processing capabilities, one or more processors, program code storage for storing program instructions executable by the one or more processors, as well as user input devices and user output devices, not all of which are shown. Merging system 1160 might operate autonomously, following programming instructions, or might have a user interface or programmatic interface over which an operator can control a merging process. In some embodiments, an operator can specify parameter values to use in a merging process and/or might specify specific tweaks to be made to an output of merging system 1160, such as modifying boundaries of segmented objects, inserting blurs to smooth out imperfections, or adding other effects. Based on its inputs, merging system 1160 can output an image to be stored in a static image storage 1170 and/or a sequence of images in the form of video to be stored in an animated/combined video storage 1172.

Thus, as described, visual content generation system 1100 can be used to generate video that combines live action with computer-generated animation using various components and tools, some of which are described in more detail herein.

While visual content generation system 1100 might be useful for such combinations, with suitable settings, it can be used for outputting entirely live action footage or entirely CGI sequences. The code may also be provided and/or carried by a transitory computer readable medium, e.g., a transmission medium such as in the form of a signal transmitted over a network.

According to one embodiment, the techniques described herein are implemented by one or more generalized computing systems programmed to perform the techniques pursuant to program instructions in firmware, memory, other storage, or a combination. Special-purpose computing devices may be used, such as desktop computer systems, portable computer systems, handheld devices, networking devices or any other device that incorporates hard-wired and/or program logic to implement the techniques.

Figure 12:
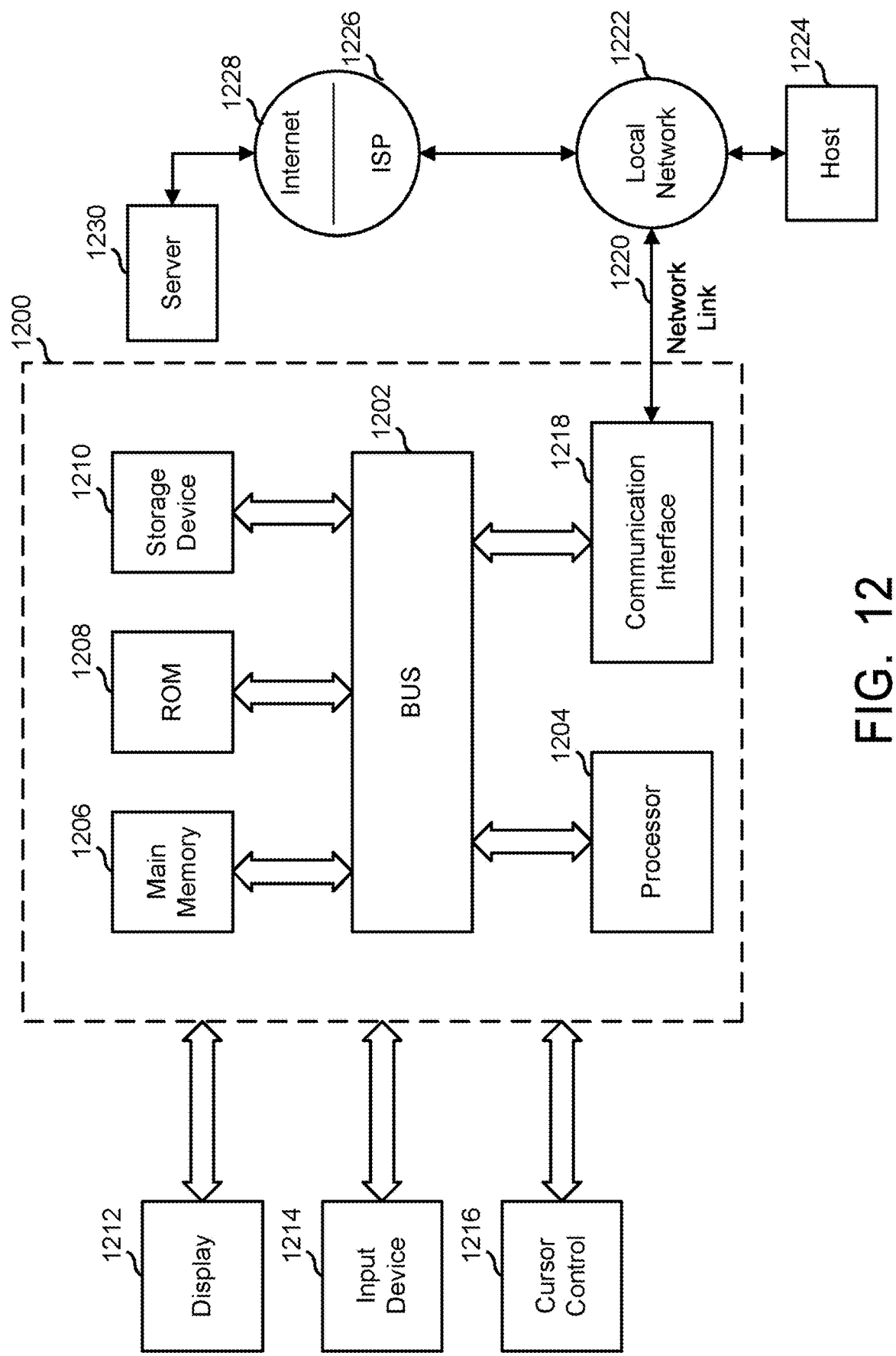
FIG. 12 illustrates a block diagram illustrating an example computer system upon which computer systems of the systems illustrated in FIGS. 1, 7, and 11 may be implemented in accordance with an embodiment.

For example, FIG. 12 is a block diagram that illustrates a computer system 1200 upon which the computer systems of the systems described herein and/or visual content generation system 1100 (see FIG. 11) may be implemented. Computer system 1200 includes a bus 1202 or other communication mechanism for communicating information, and a processor 1204 coupled with bus 1202 for processing information. Processor 1204 may be, for example, a general-purpose microprocessor.

Computer system 1200 also includes a main memory 1206, such as a random-access memory (RAM) or other dynamic storage device, coupled to bus 1202 for storing information and instructions to be executed by processor 1204. Main memory 1206 may also be used for storing temporary variables or other intermediate information during execution of instructions to be executed by processor 1204. Such instructions, when stored in non-transitory storage media accessible to processor 1204, render computer system 1200 into a special-purpose machine that is customized to perform the operations specified in the instructions.

Computer system 1200 further includes a read only memory (ROM) 1208 or other static storage device coupled to bus 1202 for storing static information and instructions for processor 1204. A storage device 1210, such as a magnetic disk or optical disk, is provided and coupled to bus 1202 for storing information and instructions.

Computer system 1200 may be coupled via bus 1202 to a display 1212, such as a computer monitor, for displaying information to a computer user. An input device 1214, including alphanumeric and other keys, is coupled to bus 1202 for communicating information and command selections to processor 1204. Another type of user input device is a cursor control 1216, such as a mouse, a trackball, or cursor direction keys for communicating direction information and command selections to processor 1204 and for controlling cursor movement on display 1212. This input device typically has two degrees of freedom in two axes, a first axis (e.g., x) and a second axis (e.g., y), that allows the device to specify positions in a plane.

Computer system 1200 may implement the techniques described herein using customized hard-wired logic, one or more ASICs or FPGAs, firmware and/or program logic which in combination with the computer system causes or programs computer system 1200 to be a special-purpose machine. According to one embodiment, the techniques herein are performed by computer system 1200 in response to processor 1204 executing one or more sequences of one or more instructions contained in main memory 1206. Such instructions may be read into main memory 1206 from another storage medium, such as storage device 1210. Execution of the sequences of instructions contained in main memory 1206 causes processor 1204 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may include non-volatile media and/or volatile media. Non-volatile media includes, for example, optical or magnetic disks, such as storage device 1210. Volatile media includes dynamic memory, such as main memory 1206. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, an EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire, and fiber optics, including the wires that include bus 1202. Transmission media can also take the form of acoustic or light waves, such as those generated during radio-wave and infra-red data communications.

Various forms of media may be involved in carrying one or more sequences of one or more instructions to processor 1204 for execution. For example, the instructions may initially be carried on a magnetic disk or solid-state drive of a remote computer. The remote computer can load the instructions into its dynamic memory and send the instructions over a network connection. A modem or network interface local to computer system 1200 can receive the data. Bus 1202 carries the data to main memory 1206, from which processor 1204 retrieves and executes the instructions. The instructions received by main memory 1206 may optionally be stored on storage device 1210 either before or after execution by processor 1204.

Computer system 1200 also includes a communication interface 1218 coupled to bus 1202. Communication interface 1218 provides a two-way data communication coupling to a network link 1220 that is connected to a local network 1222. For example, communication interface 1218 may be a network card, a modem, a cable modem, or a satellite modem to provide a data communication connection to a corresponding type of telephone line or communications line. Wireless links may also be implemented. In any such implementation, communication interface 1218 sends and receives electrical, electromagnetic, or optical signals that carry digital data streams representing various types of information.

Network link 1220 typically provides data communication through one or more networks to other data devices. For example, network link 1220 may provide a connection through local network 1222 to a host computer 1224 or to data equipment operated by an Internet Service Provider (ISP) 1226. ISP 1226 in turn provides data communication services through the world-wide packet data communication network now commonly referred to as the "Internet" 1228. Local network 1222 and Internet 1228 both use electrical, electromagnetic, or optical signals that carry digital data streams. The signals through the various networks and the signals on network link 1220 and through communication interface 1218, which carry the digital data to and from computer system 1200, are example forms of transmission media.

Computer system 1200 can send messages and receive data, including program code, through the network(s), network link 1220, and communication interface 1218. In the Internet example, a server 1230 might transmit a requested code for an application program through the Internet 1228, ISP 1226, local network 1222, and communication interface 1218. The received code may be executed by processor 1204 as it is received, and/or stored in storage device 1210, or other non-volatile storage for later execution.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. The code may also be provided carried by a transitory computer readable medium e.g., a transmission medium such as in the form of a signal transmitted over a network.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present.

The use of examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

Further embodiments can be envisioned to one of ordinary skill in the art after reading this disclosure. In other embodiments, combinations or sub-combinations of the above-disclosed invention can be advantageously made. The example arrangements of components are shown for purposes of illustration and combinations, additions, re-arrangements, and the like are contemplated in alternative embodiments of the present invention. Thus, while the invention has been described with respect to exemplary embodiments, one skilled in the art will recognize that numerous modifications are possible.

For example, the processes described herein may be implemented using hardware components, software components, and/or any combination thereof. The specification and drawings are, accordingly, to be regarded in an illustrative rather than a restrictive sense. It will, however, be evident that various modifications and changes may be made thereunto without departing from the broader spirit and scope of the invention as set forth in the claims and that the invention is intended to cover all modifications and equivalents within the scope of the following claims.

All references, including publications, patent applications, and patents, cited herein are hereby incorporated by reference to the same extent as if each reference were individually and specifically indicated to be incorporated by reference and were set forth in its entirety herein.

What is claimed is:

1. A computer-implemented method for processing a set of virtual fibers into a set of clusters of virtual fibers, usable for manipulation on a cluster basis in a computer graphics generation system, the method comprising:

receiving, via user input to a user interface of the computer graphics generation system, virtual fibers in the set of virtual fibers;

determining aspects for the virtual fibers in the set of virtual fibers;

determining similarity scores between the virtual fibers based on their aspects;

determining an initial cluster comprising the virtual fibers of the set of virtual fibers;

instantiating a cluster list in at least one non-transitory memory;

adding the initial cluster to the cluster list;

partitioning the initial cluster into a first subsequent cluster and a second subsequent cluster based on similarity scores among the virtual fibers in the initial cluster;

adding the first subsequent cluster and the second subsequent cluster to the cluster list;

testing whether a number of clusters in the cluster list is below a predetermined threshold; and when the number of clusters is at the predetermined threshold, persisting the cluster list and the set of virtual fibers in the non-transitory memory, wherein the cluster list in the non-transitory memory enables per-cluster manipulation of the set of virtual fibers using at least the first subsequent cluster and the second subsequent cluster.

2. The computer-implemented method of claim 1, further comprising:

removing the initial cluster from the cluster list of the first subsequent cluster and the second subsequent cluster; and removing the first subsequent cluster from the cluster list of a third subsequent cluster and a fourth subsequent cluster determined from the first subsequent cluster.

3. The computer-implemented method of claim 1, further comprising:

partitioning the first subsequent cluster into a third subsequent cluster and a fourth subsequent cluster based on similarity scores among fibers in the first subsequent cluster; and adding the third subsequent cluster and the fourth subsequent cluster to the cluster list.

4. The computer-implemented method of claim 3, wherein the first subsequent cluster is selected for the partitioning into the third subsequent cluster and the fourth subsequent cluster based on at least one criterion or criteria.

5. The computer-implemented method of claim 4, wherein the at least one criterion or the criteria comprises one of the first subsequent cluster having the largest number of fibers or the largest area of representation in a vector space.

6. The computer-implemented method of claim 1, wherein determining the initial cluster comprises assigning the set of virtual fibers to the initial cluster.

7. The computer-implemented method of claim 1, wherein, for a selected first virtual fiber and a selected second virtual fiber selected from the set of virtual fibers, the selected first virtual fiber comprising a first plurality of points and the selected second virtual fiber comprising a second plurality of points, determining similarity scores between virtual fibers further comprises:
  for each point in the first plurality of points, identifying a corresponding closest point on the selected second virtual fiber to each point;
  computing a kernel based on the distance from each point in the first plurality of points to the respective corresponding closest point of the second plurality of points;
  computing a plurality of dot products, each dot product the dot product of a tangent to each point in first plurality of points and a tangent to the respective corresponding closest point of the second plurality of points; and
  computing a similarity score based on the kernel and the plurality of dot products.

8. The computer-implemented method of claim 1, wherein determining similarity scores between virtual fibers further comprises:
  for a number K of similarity scores, for each virtual fiber of the set of virtual fibers, retaining only K similarity scores having highest values of similarity scores corresponding to each virtual fiber.

9. The computer-implemented method of claim 8, wherein partitioning the initial cluster into the first subsequent cluster and the second subsequent cluster comprises:
  for each virtual fiber of the initial cluster, from corresponding similarity scores based on aspects of the virtual fiber, computing a corresponding coordinate comprising a plurality of eigenvectors, of a graph Laplacian, corresponding to the virtual fiber, producing a plurality of coordinates;
  for each similarity score between a first virtual fiber and a second virtual fiber, computing a distance from the corresponding coordinate of the first virtual fiber to the corresponding coordinate of the second virtual fiber, producing a plurality of edge values;
  assigning each virtual fiber in the initial cluster to a corresponding set having one member;
  identifying a min virtual fiber and a max virtual fiber in the initial cluster;
  sorting the plurality of edge values into a list; and
  while the list is not empty:
    (1) removing a shortest edge value from the list; and
    (2) if the set of clusters of virtual fibers containing the min virtual fiber and the max virtual fiber remain disjoint, merging the sets containing virtual fibers corresponding to the shortest edge value.

10. The computer-implemented method of claim 9, wherein the distance is a Euclidian distance.

11. The computer-implemented method of claim 9, wherein the min virtual fiber and the max virtual fiber are selected to correspond to a minimum and a maximum eigenvector of the graph Laplacian.

12. The computer-implemented method of claim 1, wherein the initial cluster is one of two first clusters, and wherein the partitioning is based on the initial cluster being the larger one of the two first clusters.

13. A computer graphics generation system for processing a set of virtual fibers into a set of clusters of virtual fibers, usable for manipulation on a cluster basis, the computer graphics generation system comprising:
  at least one processor; and
  a computer-readable medium storing instructions, which when executed by the at least one processor, causes the computer graphics generation system to perform operations comprising:
    receiving, via user input to a user interface of the computer graphics generation system, virtual fibers in the set of virtual fibers;
    determining aspects for virtual fibers in the set of virtual fibers;
    determining similarity scores between the virtual fibers based on their aspects;
    determining an initial cluster comprising the virtual fibers of the set of virtual fibers;
    instantiating a cluster list in at least one non-transitory memory;
    adding the initial cluster to the cluster list;
    partitioning the initial cluster into a first subsequent cluster and a second subsequent cluster based on similarity scores among the virtual fibers in the initial cluster;
    adding the first subsequent cluster and the second subsequent cluster to the cluster list;
    testing whether a number of clusters in the cluster list is below a predetermined threshold; and
    when the number of clusters is at the predetermined threshold, persisting the cluster list and the set of virtual fibers in the non-transitory memory, wherein the cluster list in the non-transitory memory enables per-cluster manipulation of the set of virtual fibers using at least the first subsequent cluster and the second subsequent cluster.

14. The computer graphics generation system of claim 13, further comprising:
  removing the initial cluster from the cluster list of the first subsequent cluster and the second subsequent cluster; and
  removing the first subsequent cluster from the cluster list of a third subsequent cluster and a fourth subsequent cluster determined from the first subsequent cluster.

15. The computer graphics generation system of claim 13, further comprising:
  partitioning the first subsequent cluster into a third subsequent cluster and a fourth subsequent cluster based on similarity scores among fibers in the first subsequent cluster; and
  adding the third subsequent cluster and the fourth subsequent cluster to the cluster list.

16. The computer graphics generation system of claim 15, wherein the first subsequent cluster is selected for the partitioning into the third subsequent cluster and the fourth subsequent cluster based on at least one criterion or criteria.

17. The computer graphics generation system of claim 16, wherein the at least one criterion or the criteria comprises one of the first subsequent cluster having the largest number of fibers or the largest area of representation in a vector space.

18. The computer graphics generation system of claim 13, wherein determining the initial cluster comprises assigning the set of virtual fibers to the initial cluster.

19. The computer graphics generation system of claim 13, wherein, for a selected first virtual fiber and a selected second virtual fiber selected from the set of virtual fibers, the selected first virtual fiber comprising a first plurality of points and the selected second virtual fiber comprising a second plurality of points, determining similarity scores between virtual fibers further comprises:
- for each point in the first plurality of points, identifying a corresponding closest point on the selected second virtual fiber to each point;
- computing a kernel based on the distance from each point in the first plurality of points to the respective corresponding closest point of the second plurality of points;
- computing a plurality of dot products, each dot product the dot product of a tangent to each point in first plurality of points and a tangent to the respective corresponding closest point of the second plurality of points; and
- computing a similarity score based on the kernel and the plurality of dot products.

20. The computer graphics generation system of claim 13, wherein determining similarity scores between virtual fibers further comprises:
- for a number K of similarity scores, for each virtual fiber of the set of virtual fibers, retaining only K similarity scores having highest values of similarity scores corresponding to each virtual fiber.

21. The computer graphics generation system of claim 20, wherein partitioning the initial cluster into the first subsequent cluster and the second subsequent cluster comprises:
- for each virtual fiber of the initial cluster, from corresponding similarity scores based on aspects of the virtual fiber, computing a corresponding coordinate comprising a plurality of eigenvectors, of a graph Laplacian, corresponding to the virtual fiber, producing a plurality of coordinates;
- for each similarity score between a first virtual fiber and a second virtual fiber, computing a distance from the corresponding coordinate of the first virtual fiber to the corresponding coordinate of the second virtual fiber, producing a plurality of edge values;
- assigning each virtual fiber in the initial cluster to a corresponding set having one member;
- identifying a min virtual fiber and a max virtual fiber in the initial cluster;
- sorting the plurality of edge values into a list; and
- while the list is not empty:
  (1) removing a shortest edge value from the list; and
  (2) if the set of clusters of virtual fibers containing the min virtual fiber and the max virtual fiber remain disjoint, merging the sets containing virtual fibers corresponding to the shortest edge value.

22. The computer graphics generation system of claim 21, wherein the min virtual fiber and the max virtual fiber are selected to correspond to a minimum and a maximum eigenvector of the graph Laplacian.

23. A system comprising: at least one processor, and a storage medium storing instructions, which when executed by the at least one processor, cause the system to implement the computer-implemented method of claim 1.

24. A non-transitory computer-readable storage medium storing instructions, which when executed by at least one processor of a computer system, causes the computer system to carry out the computer-implemented method of claim 1.

* * * * *